US008766671B2

(12) United States Patent
Senda et al.

(10) Patent No.: US 8,766,671 B2
(45) Date of Patent: Jul. 1, 2014

(54) LOAD DRIVING APPARATUS

(75) Inventors: Yasutaka Senda, Nukata-gun (JP);
Ryotaro Miura, Nukata-gun (JP);
Kazuki Yamauchi, Nukata-gun (JP)

(73) Assignee: Denso Corporation, Kariya (JP)

( * ) Notice: Subject to any disclaimer, the term of this patent is extended or adjusted under 35 U.S.C. 154(b) by 308 days.

(21) Appl. No.: 13/296,429

(22) Filed: Nov. 15, 2011

(65) Prior Publication Data

US 2012/0126858 A1 May 24, 2012

(30) Foreign Application Priority Data

Nov. 22, 2010 (JP) ................................. 2010-260398
Nov. 22, 2010 (JP) ................................. 2010-260401
Sep. 26, 2011 (JP) ................................. 2011-209035

(51) Int. Cl.
*H03K 3/00* (2006.01)

(52) U.S. Cl.
USPC ........................................................ 327/108

(58) Field of Classification Search
None
See application file for complete search history.

(56) References Cited

U.S. PATENT DOCUMENTS

| 5,764,041 | A  | * | 6/1998 | Pulvirenti et al. | 323/282 |
| 6,198,315 | B1 | * | 3/2001 | Nakano | 327/110 |
| 6,222,403 | B1 |   | 4/2001 | Mitsuda | |
| 6,573,693 | B2 | * | 6/2003 | Okamoto | 323/273 |
| 7,336,122 | B2 | * | 2/2008 | Ko et al. | 327/538 |
| 7,436,225 | B2 | * | 10/2008 | Arashima et al. | 327/108 |
| 7,924,065 | B2 | * | 4/2011 | Forster et al. | 327/108 |
| 8,217,686 | B2 | * | 7/2012 | Falter et al. | 327/110 |
| 2009/0002054 | A1 | | 1/2009 | Tsunoda et al. | |

FOREIGN PATENT DOCUMENTS

| JP | S611117 A | 1/1986 |
| JP | A-H01-092817 | 4/1989 |
| JP | A-06-275227 | 9/1994 |
| JP | B2-3680722 | 5/2005 |

OTHER PUBLICATIONS

Office Action mailed Dec. 25, 2012 in corresponding JP Application No. 2010-260401 (and English translation).
Office action mailed on May 7, 2013 in corresponding Japanese application 2010-260401.
Office Action mailed by the State Intellectual Property Office of the People's Republic of China on Nov. 25, 2013 in corresponding Chinese Patent Application No. 201110373382.9 (and English translation).

\* cited by examiner

*Primary Examiner* — Lincoln Donovan
*Assistant Examiner* — Khareem E Almo
(74) *Attorney, Agent, or Firm* — Posz Law Group, PLC

(57) ABSTRACT

A load driving apparatus for driving a load with a constant current includes a shunt resistor and a driver circuit. A shunt current corresponding to the constant current flows though the shunt resistor. The driver circuit is connected to a first end of the shunt resistor to supply the constant current corresponding to the shunt current to the load. The driver circuit includes a reference voltage source for generating a predetermined reference voltage. The driver circuit adjusts the magnitude of the constant current by performing a feedback-control of the magnitude of the shunt current in such a manner that a first voltage corresponding to the reference voltage and a second voltage corresponding to a voltage at the first end of the shunt resistor become equal to each other.

17 Claims, 28 Drawing Sheets

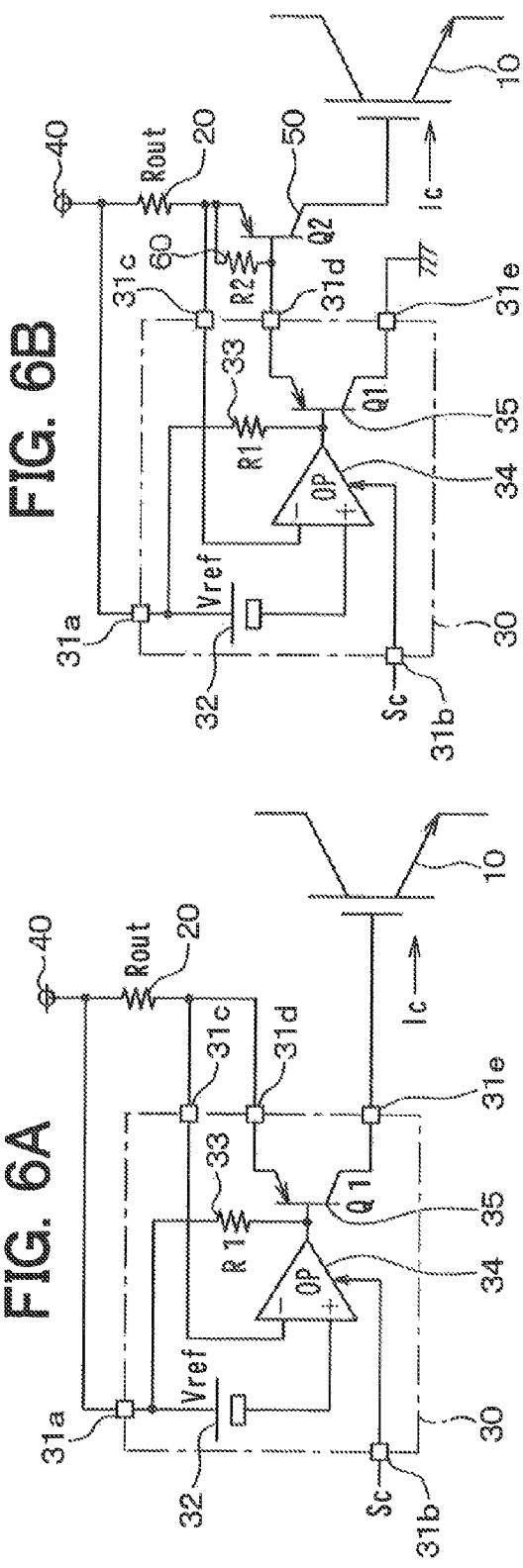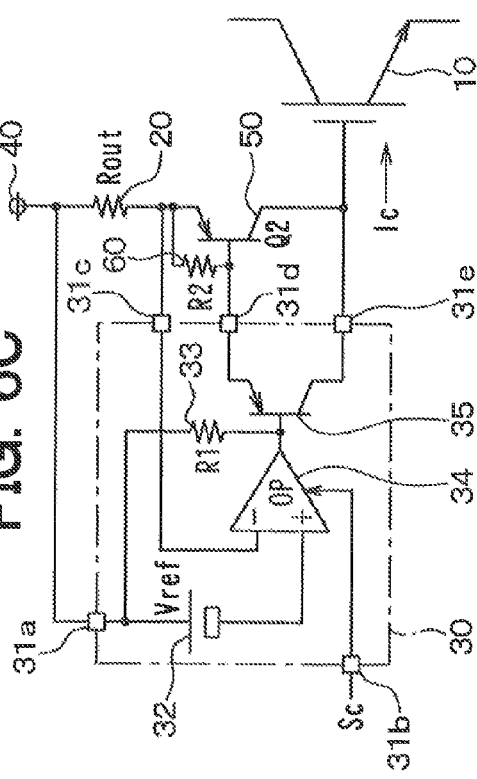
FIG. 6A  FIG. 6B  FIG. 6C

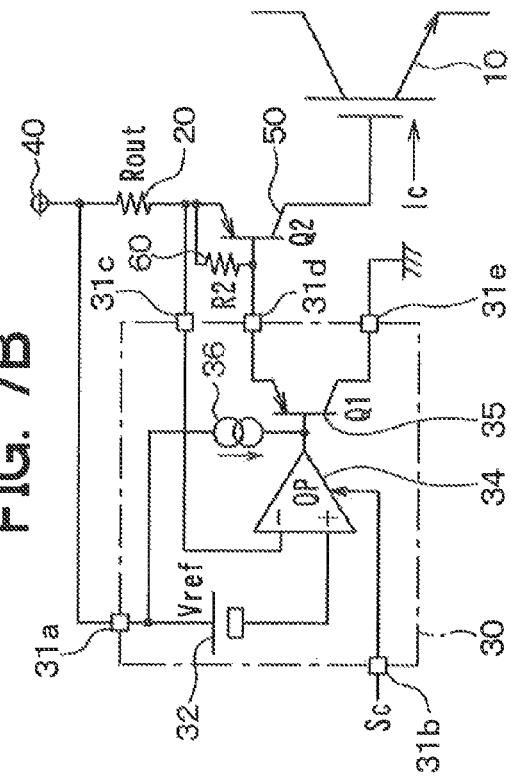
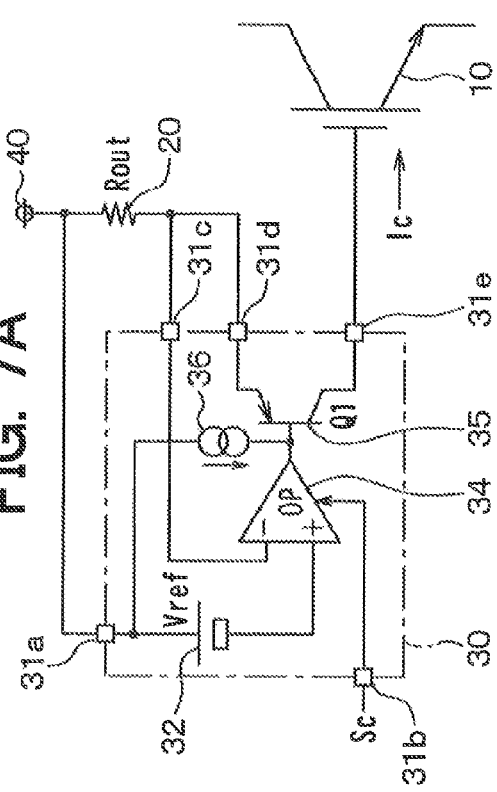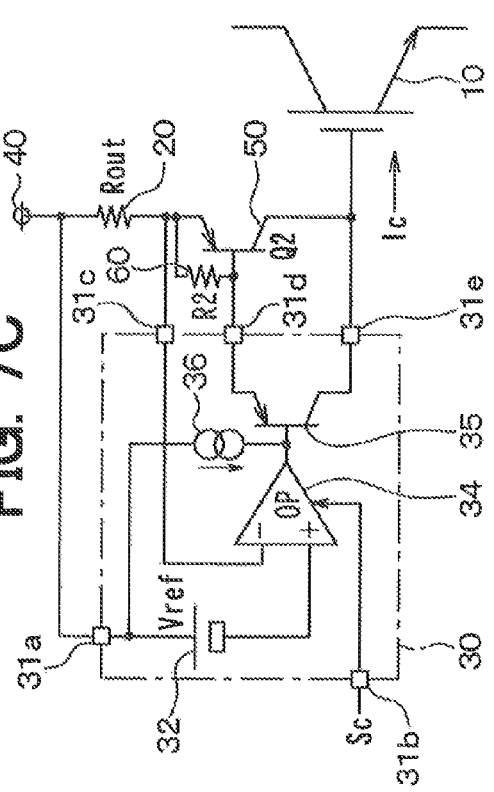

US 8,766,671 B2

LOAD DRIVING APPARATUS

CROSS REFERENCE TO RELATED APPLICATION

This application is based on and claims priority to Japanese Patent Application No. 2010-260398 filed on Nov. 22, 2010, No. 2010-260401 filed on Nov. 22, 2010, and No. 2011-209035 filed on Sep. 26, 2011, the contents of which are incorporated herein by reference.

TECHNICAL FIELD

The present invention relates to a load driving apparatus for driving a load with a constant current.

BACKGROUND

US 2009/0002054 corresponding to JP-A-2009-11049 discloses a gate driver circuit for driving a gate of a switching device (as a load) with a constant current. In the gate driver circuit, a series circuit of a first resistor and a second resistor is connected to a power source, and a base of a PNP transistor is connected to a node between the first resistor and the second resistor. Further, a MOS transistor is connected to the second resistor. Further, a collector of the PNP transistor is connected through a third resistor to the power source, and an emitter of the PNP transistor is connected to the gate of the switching device.

In the gate driver circuit, when the MOS transistor is turned ON, the PNP transistor is turned ON so that the constant current can flow from the power source to the gate of the switching device through the third resistor and the PNP transistor. Thus, the switching device is turned ON.

However, in the gate driver circuit, the constant current flowing to the switching device can vary due to temperature dependences of a gain (i.e., amplification factor) and a forward voltage Vf of the PNP transistor. Therefore, it is difficult to ensure the accuracy of the constant current.

Further, since the magnitude of the constant current supplied to the load varies depending on types of loads, the gate driver circuit is designed for the load that needs the maximum constant current. Therefore, the cost of the gate driver circuit is increased.

US 2009/0002054 further discloses that two NPN transistors are connected in a Darlington configuration to increase driving speed. However, this configuration consumes a large amount of current, because the collector of one NPN transistor is connected to the power source.

JP-3680722 discloses another constant-current gate driver circuit for turning ON and OFF an insulated gate bipolar transistor (IGBT). In the gate drive circuit, a constant current circuit constructed with a MOSFET and a resistor is connected to each of the high side and low side of the gate of the IGBT, and a gate voltage of the MOSFET is controlled by an operational amplifier to control a current flowing to the gate of the IGBT. Then, a current flowing between a collector and an emitter of the IGBT is detected by an overcurrent detection circuit. The overcurrent detection circuit outputs a detection signal upon detection of overcurrent. The detection signal is fed back to adjust an output of the operational amplifier. Thus, the current flowing to the gate of the IGBT is controlled so that the IGBT can be protected from overcurrent.

In the gate driver circuit disclosed in JP-3680722, the constant current circuit performs a feedback control to improve accuracy of the constant current. Further, the constant current circuit is constructed with a MOSFET, a driving speed may be improved. However, JP-3680722 fails to disclose a specific configuration to improve the driving speed.

SUMMARY OF THE INVENTION

In view of the above, it is an object of the present invention to provide a load driving apparatus for supplying an accurate constant current to a load, for improving flexibility in changing the magnitude of the constant current, for increasing a driving speed, and/or for reducing consumption current.

According to a first aspect of the present invention, a load driving apparatus for driving a load with a constant current includes a shunt resistor and a driver circuit. A shunt current corresponding to the constant current flows through the shunt resistor. The driver circuit is connected to a first end of the shunt resistor to supply the constant current corresponding to the shunt current to the load. The driver circuit includes a reference voltage source for generating a predetermined reference voltage. The driver circuit adjusts the magnitude of the constant current by performing a feedback-control of the magnitude of the shunt current in such a manner that a first voltage corresponding to the reference voltage becomes equal to a second voltage corresponding to a voltage at the first end of the shunt resistor.

According to a second aspect of the present invention, a load driving apparatus includes a switching device, a Darlington circuit, a first reference voltage source, an operational amplifier, and a switch. The switching device has a control terminal for receiving a constant current. The switching device further has first and second terminals for passing a load current therebetween upon receipt of the constant current by the control terminal of the switching device. The Darlington circuit includes a first transistor, a second transistor connected to the first transistor in a Darlington configuration, a sensing resistor connected to a first terminal of the first transistor so that the constant current flows through the first resistor, and a pull-up member connected to a control terminal of the first transistor and a first terminal of the second transistor. Second terminals of the first transistor and the second transistor are connected to the control terminal of the switching device. The first reference voltage source generates a reference voltage. The operational amplifier has a first terminal for receiving a first voltage corresponding to the reference voltage and a second terminal for receiving a second voltage between the sensing resistor and the first transistor. The operational amplifier performs a feedback control of the constant current flowing through the sensing resistor in such a manner that the first voltage becomes equal to the second voltage. The switch is connected in parallel to the pull-up member and configured to connect and disconnect the control terminal of the first transistor to and from the first terminal of the first transistor.

According to a third aspect of the present invention, a load driving apparatus includes a switching device, a Darlington circuit, a first reference voltage source, an operational amplifier, and a first switch, and a series circuit. The switching device has a control terminal for receiving a constant current. The switching device further has first and second terminals for passing a load current therebetween upon receipt of the constant current by the control terminal of the switching device. The Darlington circuit includes a first transistor, a second transistor connected to the first transistor in a Darlington configuration, a sensing resistor connected to a first terminal of the first transistor so that the constant current flows through the first resistor, and a pull-up member connected to a control terminal of the first transistor and a first terminal of the second transistor. A second terminal of the first transistor is connected to the control terminal of the switching device. The second terminal of the second transistor is connected to a ground potential. The first reference voltage source generates a reference voltage. The operational amplifier has a first terminal for receiving a first voltage corresponding to the reference voltage and a second terminal for receiving a second voltage between the sensing resistor and the first transistor. The operational amplifier performs a feedback control of the constant current flowing through the sensing resistor in such a manner that the first voltage becomes equal to the second voltage. The first switch is connected in parallel to the pull-up member and configured to connect and disconnect the control terminal of the first transistor to and from the first terminal of the first transistor. The series circuit is connected in parallel to the second resistor and includes a third resistor and a second switch connected in series with the second resistor. A resistance of the second resistor is larger than a resistance of the third resistor.

BRIEF DESCRIPTION OF THE DRAWINGS

The above and other objects, features, and advantages will become more apparent from the following description and drawings in which like reference numerals depict like elements. In the drawings:

FIGS. 6A-6C are circuit diagrams of a load driving apparatus according to a fourth embodiment of the present invention;

FIGS. 7A-7C are circuit diagrams of a load driving apparatus according to a fifth embodiment of the present invention;

DETAILED DESCRIPTION OF THE PREFERRED EMBODIMENTS

First Embodiment

A load driving apparatus according to a first embodiment of the present invention is described below with reference to FIG. 1.

The load driving apparatus is configured to drive a load 10 with a constant current Ic. For example, the load 10 can be an insulated gate bipolar transistor (IGBT), a power MOSFET, a capacitance load, or a resistance load. According to the first embodiment, the load 10 is an IGBT. The load 10 is connected to another load such as a motor, and the other load is driven by the load 10.

Figure 1:
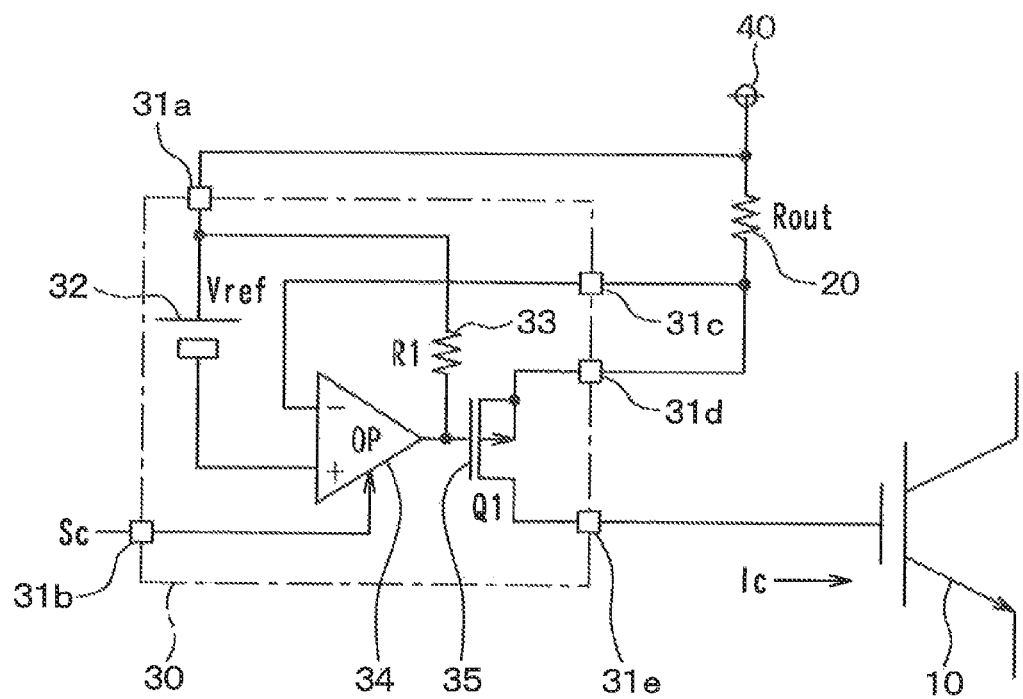
FIG. 1 is a circuit diagram of a load driving apparatus according to a first embodiment of the present invention.

As shown in FIG. 1, the load driving apparatus includes a shunt resistor 20 and a driver circuit 30.

The shunt resistor 20 has a resistance Rout and used as a sensing resistor. A current corresponding to the constant current Ic flows through the shunt resistor 20. A first end of the shunt resistor 20 is connected to the driver circuit 30, and a second end of the shunt resistor 20 is connected to a power source 40.

The driver circuit 30 drives the load 10 by supplying the constant current Ic, corresponding to the current flowing through the shunt resistor 20, to the load 10. For example, the driver circuit 30 can be implemented in a single IC chip. Alternatively, the driver circuit 30 can be implemented in multiple IC chips.

The driver circuit 30 includes a first terminal 31a, a second terminal 31b, a third terminal 31c, a fourth terminal 31d, a fifth terminal 31e, a reference voltage source 32, a first resistor 33, an operational amplifier 34 (labeled as "OP"), and a first switching element 35 (labeled as "Q1"). The first to fifth terminals 31a-31e are terminals of the IC chip.

The reference voltage source 32 generates a reference voltage Vref. A positive terminal of the reference voltage source 32 is connected to the first terminal 31a. The power source 40 and the second end of the shunt resistor 20 are connected to the first terminal 31a. On the other hand, a negative terminal of the reference voltage source 32 is connected to a non-inverting input terminal (+) of the operational amplifier 34.

The first resistor 33 is a gate pull-up resistor for turning OFF the first switching element 35. A first end of the first resistor 33 is connected to the positive terminal of the reference voltage source 32, and a second end of the first resistor 33 is connected to an output terminal of the operational amplifier 34. In FIG. 1, the first resistor 33 is a separate piece from the operational amplifier 34. Alternatively, the first resistor 33 can be incorporated in the operational amplifier 34.

The operational amplifier 34 adjusts the magnitude of the constant current Ic supplied to the load 10 by performing a feedback-control of the current flowing through the shunt resistor 20 based on the reference voltage Vref. The operational amplifier 34 is controlled by a control signal Sc. The control signal Sc is inputted from an external circuit to the driver circuit 30 through the second terminal 31b. Thus, the load 10 is controlled by the control signal Sc.

As mentioned previously, the non-inverting input terminal (+) of the operational amplifier 34 is connected to the negative terminal of the reference voltage source 32. Thus, a first voltage corresponding to the reference voltage Vref is applied to the non-inverting input terminal (+) of the operational amplifier 34. The first voltage is calculated by subtracting the reference voltage Vref from a power supply voltage VB of the power source 40. On the other hand, an inverting input terminal (−) of the operational amplifier 34 is connected to the third terminal 31c. The first end of the shunt resistor 20 is connected to the third terminal 31c. Thus, a second voltage at the first end of the shunt resistor 20 is applied to the inverting input terminal (−) of the operational amplifier 34. The second voltage is calculated by subtracting a voltage drop across the shunt resistor 20 from the power supply voltage VB of the power source 40.

The first switching element 35 is switched (i.e., turned ON and OFF) by an output signal of the operational amplifier 34. According to the first embodiment, the first switching element 35 is a P-channel power MOSFET. A gate of the first switching element 35 is connected to the output terminal of the operational amplifier 34, and a source of the first switching element 35 is connected to the fourth terminal 31d. The first end of the shunt resistor 20 is connected to the fourth terminal 31d. A drain of the first switching element 35 is connected to the fifth terminal 31e. The gate of the load 10 is connected to the fifth terminal 31e.

Figure 2:
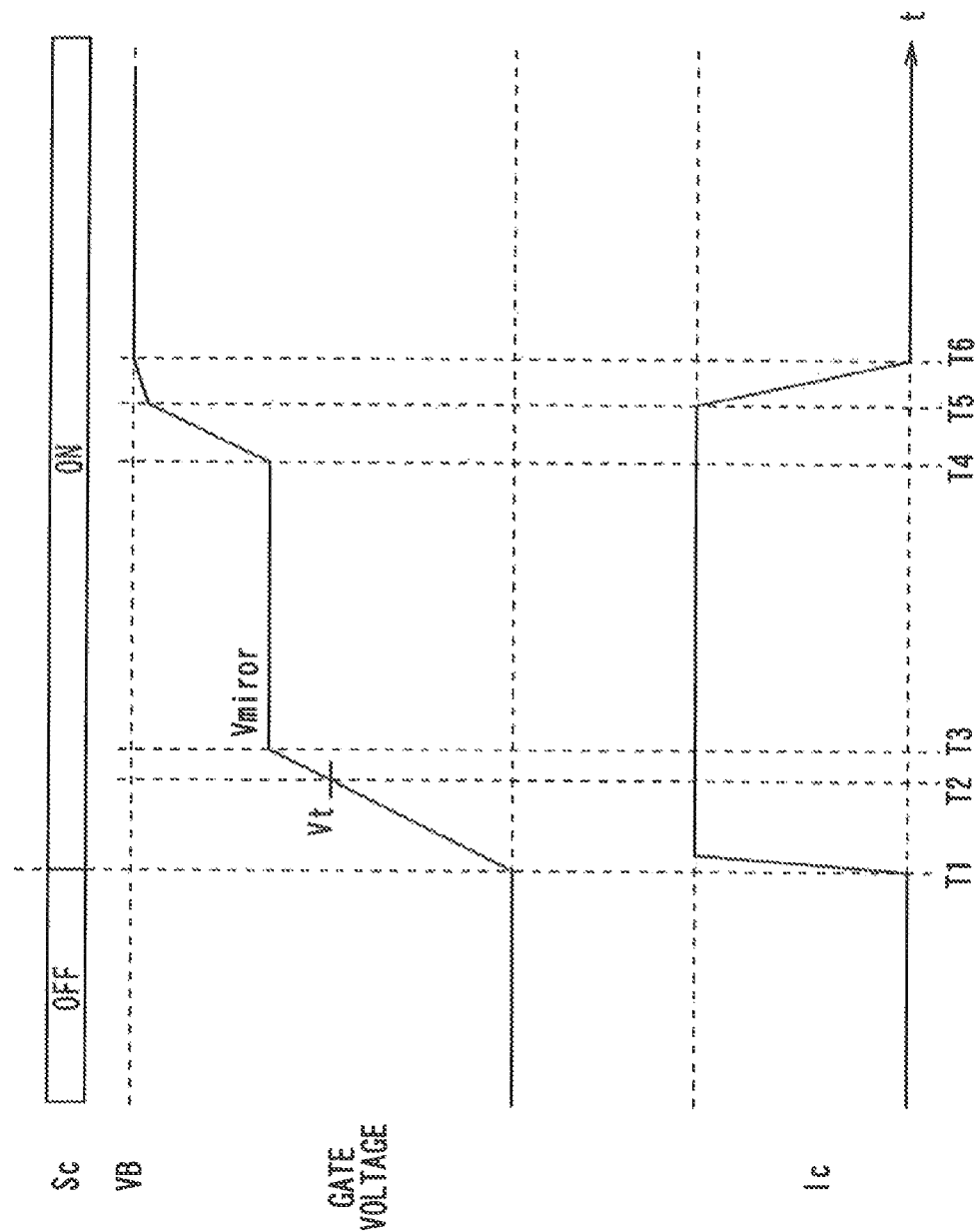
FIG. 2 is a timing diagram of the load driving apparatus according to the first embodiment.

Next, an operation of the load driving apparatus of FIG. 1 is described below with reference to FIG. 2. FIG. 2 is a timing diagram of the load driving apparatus observed when the load 10 is turned ON from OFF. In FIG. 2, the control signal Sc, the gate voltage of the load 10, and the constant current Ic supplied to the gate of the load 10 are shown.

Firstly, when the control signal Sc is inputted from the external circuit to the driver circuit 30 at a time T1, the operational amplifier 34 turns ON the first switching element 35. Thus, a current path from the power source 40 to the load 10 through the shunt resistor 20 and the first switching element 35 is created, and the constant current Ic flows to the gate of the load 10.

When the constant current Ic flows to the load 10, the gate voltage of the load 10 increases at a rate depending on the magnitude of the constant current Ic. Then, when the gate voltage of the load 10 reaches a threshold voltage Vt of the load 10 at a time T2, the load 10 is turned ON. Then, when the gate voltage of the load 10 reaches a mirror voltage Vmirror at a time T3, the gate voltage of the load 10 is kept constant at the mirror voltage Vmirror from the time T3 until a time T4. The mirror voltage depends on characteristics (e.g., gain) of the load 10. A time period from the time T3 to the time T4, where the gate voltage of the load 10 is kept constant at the mirror voltage Vmirror, is hereinafter called "mirror period".

When the mirror period elapses at the time T4, the gate voltage of the load 10 starts to increase again. Then, when the first switching element 35 is fully ON at a time T5, a voltage between the drain and the source of the first switching element 35 becomes small so that the constant current Ic can be reduced. Then, when the gate voltage of the load 10 reaches the power supply voltage VB of the power source 40 at a time T6, the load 10 is fully ON, and the constant current Ic becomes almost zero. In this way, the load 10 is driven.

During the time period from the time T1 to the time T6, the driver circuit 30 operates to supply the constant current Ic to the load 10. That is, during the time period from the time T1 to the time T6, the driver circuit 30 performs the feedback-control of the current flowing through the shunt resistor 20 in such a manner that the first voltage corresponding to the reference voltage Vref can become equal to the second voltage corresponding to the voltage at the first end of the shunt resistor 20.

Specifically, the operational amplifier 34 of the driver circuit 30 keeps the current flowing through the shunt register 20 at a constant value by driving the first switching element 35 in such a manner that the first voltage and the second voltage become equal to each other. In other words, since the constant current Ic is given as follows: Ic=Vref/Rout, the operational amplifier 34 controls the gate of the first switching element 35 to satisfy the following equation: Vref=Rout×Ic.

If the constant current Ic becomes unstable, the rate at which the gate voltage of the load 10 increases varies. In such a case, the load 10 cannot be controlled stably. For example, the gate voltage of the load 10 may frequently exceed the threshold voltage Vt or the load 10 may be turned ON with a delay.

To avoid such disadvantages, according to the first embodiment, the magnitude of the current flowing through the shunt resistor 20 is feedback-controlled so that the magnitude of the current flowing through the shunt resistor 20 can be kept constant during the time period from the time T1 to the time T6. Thus, the rate at which the gate voltage of the load 10 increases is kept constant during the time period from the time T1 to the time T3 and the time period from the time T4 and the time T5. Therefore, the load 10 can be controlled stably.

As described above, according to the first embodiment, the driver circuit 30 performs the feedback-control of the current flowing through the shunt resistor 20 in such a manner that the magnitude of the current flowing through the shunt resistor 20 can be kept constant. Thus, the constant current Ic supplied from the driver circuit 30 to the load 10 is kept constant. Therefore, a variation in the constant current Ic can be reduced.

The driver circuit 30 has the operational amplifier 34 and performs the feedback-control by using the operational amplifier 34. Since the operational amplifier 34 is used specifically to perform the feedback-control, the operational amplifier 34 can accurately perform the feedback-control.

According to the first embodiment, a current capability of the first switching element 35 can be designed without taking into consideration the maximum current of the load 10 connected to the load driving apparatus. A reason for this is described below.

The current capability of the first switching element 35 is defined as the magnitude of a current that can flow through the first switching element 35. That is, when the first switching element 35 has a high current capability, a large amount of current can flow through the first switching element 35.

It is noted that when the load 10 is an IGBT, the gate capacitance of the load 10 varies largely depending on the size of the load 10. Therefore, the magnitude of the constant current Ic needs to be determined based on the size of the load 10 in order to balance a relationship between a surge and a switching loss. Therefore, the load driving apparatus needs to have flexibility in changing the magnitude of the constant current Ic according to the size of the load 10.

According to the first embodiment, the magnitude of the constant current Ic can be changed according to the size of the load 10 by adding additional switching element to a basic configuration constructed with the shunt resistor 20 and the driver circuit 30 (i.e., IC chip). For this reason, the current capability of the first switching element 35 can be designed without taking into consideration the maximum current of the load 10. Details are described below with reference to FIG. 3.

Figure 3:
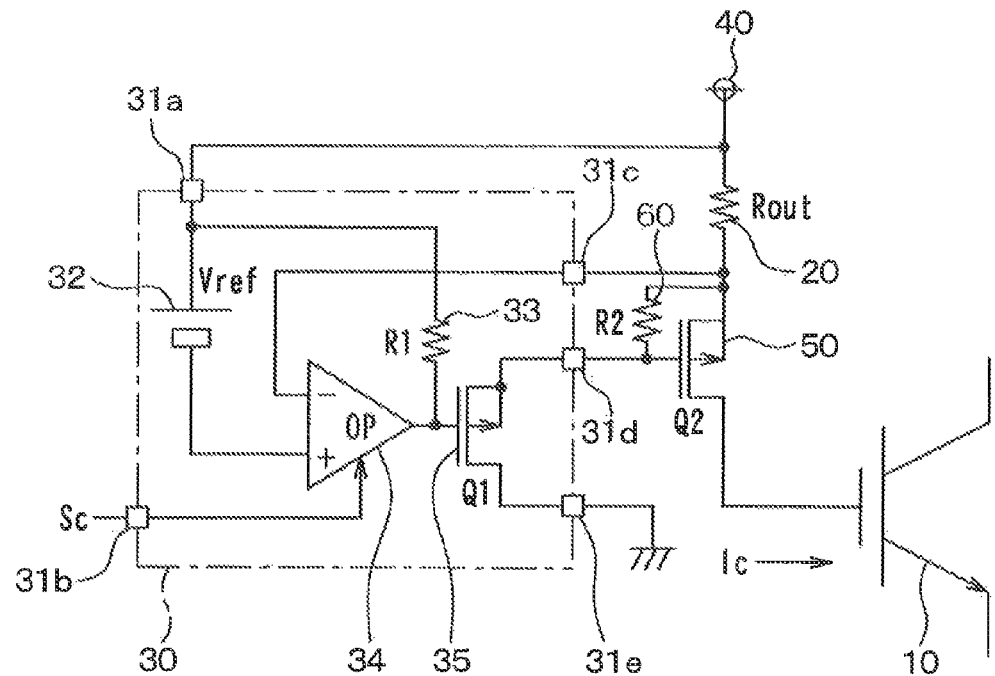
FIG. 3 is a circuit diagram of a load driving apparatus according to a modification of the first embodiment.

FIG. 3 is a circuit diagram of a load driving apparatus according to a modification of the first embodiment. The load 10 shown in FIG. 3 is larger in size than the load 10 shown in FIG. 1. Therefore, the constant current Ic supplied to the load 10 from the load driving apparatus of FIG. 3 needs to be larger than the constant current Ic supplied to the load 10 from the load driving apparatus of FIG. 1. Compared to the load driving apparatus of FIG. 1, the load driving apparatus of FIG. 3 further includes a second switching element 50 and a second resistor 60 having a resistance R2.

The first end of the shunt resistor 20 is connected to the driver circuit 30 and the second switching element 50. The second switching element 50 is driven by the driver circuit 30. According to the first embodiment, the second switching element 50 is a P-channel power MOSFET.

The gate of the second switching element 50 is connected to the fourth terminal 31d. That is, the gate of the second switching element 50 is connected to the source of the first switching element 35. The source of the second switching element 50 is connected to the first end of the shunt resistor 20. The drain of the second switching element 50 is connected to the load 10. Thus, the first switching element 35 and the second switching element 50 are connected together in a Darlington configuration. Since the second switching element 50 is connected to the load 10, the fifth terminal 31e of the driver circuit 30 is connected to a predetermined reference potential. In FIG. 3, the reference potential is illustrated by a symbol of ground. However, the reference potential is not limited to ground.

A current capability of the second switching element 50 is higher than that of the driver circuit 30. In other words, the current capability of the second switching element 50 is higher than that of the first switching element 35. The second switching element 50 is implemented in a semiconductor chip separate from the IC chip of the driver circuit 30.

The current capability and a heat dissipation capability of the first switching element 35 depend on the size of the IC chip of the driver circuit 30. After the IC chip is manufactured, the current capability of the first switching element 35 cannot be increased. However, the constant current Ic supplied to the load 10 can be increased by connecting the second switching element 50 having a chip size larger than the first switching element 35 to the driver circuit 30.

A first end of the second resistor 60 is connected to the gate of the second switching element 50, and a second end of the second resistor 60 is connected to the source of the second switching element 50.

An operation of the load driving apparatus of FIG. 3 is described below. The load driving apparatus of FIG. 3 operates in the same manner as the load driving apparatus of FIG. 1. Specifically, when the operational amplifier 34 turns ON the first switching element 35 in response to the control signal Sc, the current flows through the second resistor 60 so that a voltage between the gate and the source of the second switching element 50 can be reduced. As a result, the second switching element 50 is turned ON. Thus, a current path from the power source 40 to the load 10 through the shunt resistor 20 and the second switching element 50 is created, and the current flowing through the shunt resistor 20 flows as the constant current Ic to the gate of the load 10 through the second switching element 50.

When the constant current Ic is supplied to the load 10, the driver circuit 30 drives the second switching element 50 in such a manner that the first voltage and the second voltage become equal to each other. Specifically, the driver circuit 30 drives the second switching element 50 by driving the first switching element 35 in such a manner that the first voltage and the second voltage become equal to each other. Thus, the magnitude of the current flowing through the shunt resistor 20 is feedback-controlled so that the magnitude of the constant current Ic supplied to the load 10 can be adjusted.

A timing diagram of the load driving apparatus of FIG. 3 is the same as the timing diagram of the load driving apparatus of FIG. 1. That is, FIG. 2 shows the timing diagram of each of the load driving apparatuses of FIGS. 1 and 3. It is noted that the magnitude of the constant current Ic supplied by the load driving apparatuses of FIG. 3 is different from the magnitude of the constant current Ic supplied by the load driving apparatuses of FIG. 1.

Although the gate capacitance of the load 10 depends on the size of the load 10, the magnitude of the constant current Ic is adjusted according to the size of the load 10 by adding the second switching element 50 to the load driving apparatus. Thus, the relationship between the surge and the switching loss is balanced.

As described above, according to the modification of the first embodiment, the load driving apparatus includes the second switching element 50 in addition to the first switching element 35.

In such an approach, even when the current capability of the first switching element 35 is insufficient to supply a large constant current Ic to the load 10 having the large size, the large constant current Ic can be supplied to the load 10 by using the current capability of the second switching element 50.

Since the second switching element 50 is a separate piece from the IC chip of the driver circuit 30 including the first switching element 35, the second switching element 50 can be easily added to or removed from the load driving apparatus depending on types of the load 10. That is, the load driving apparatus has flexibility in changing the magnitude of the constant current Ic supplied to the load 10.

Second Embodiment

Figure 4:
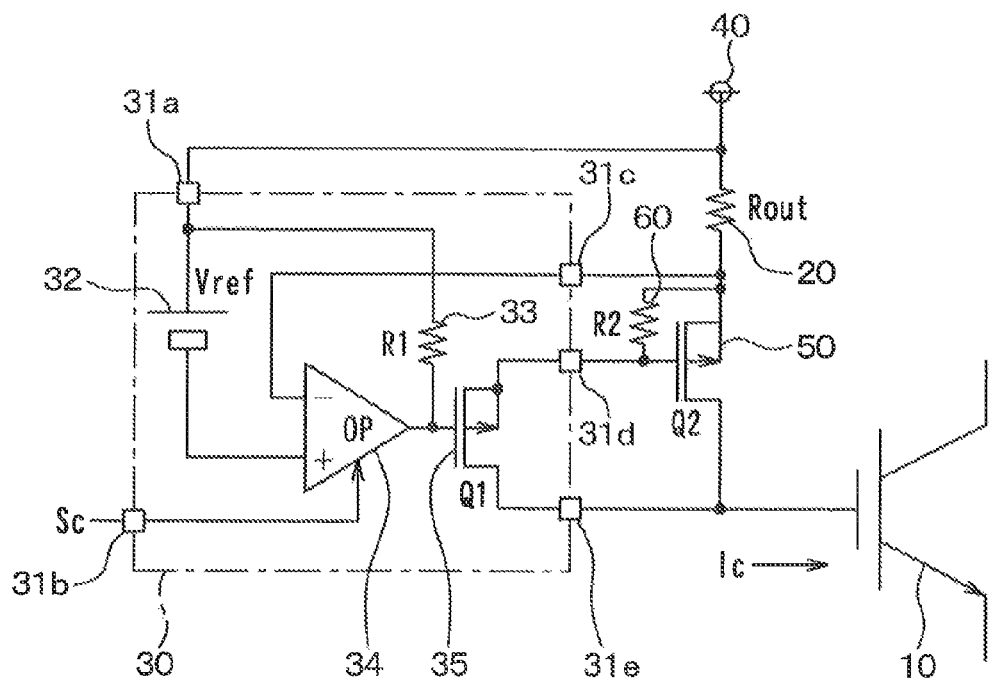
FIG. 4 is a circuit diagram of a load driving apparatus according to a second embodiment of the present invention.

A load driving apparatus according to a second embodiment of the present invention is described below with reference to FIG. 4. A difference between the first embodiment and the second embodiment is as follows.

According to the first embodiment, as shown in FIG. 3, when the second switching element 50 is added to the load driving apparatus, a current path from the power source 40 to the reference potential through the shunt resistor 20, the second resistor 60, and the first switching element 35 is created. Therefore, the current flowing through the first switching element 35 is discharged to the reference potential. As a result, the constant current Ic supplied to the load 10 may have an error. Specifically, assuming that a current IQ1 flows through the first switching element 35, and a current IQ2 flows through the second switching element 50, the constant current Ic is given as follows: Ic=IQ2=(Vref/Rout)−IQ1. Thus, the current IQ1 causes the error in the constant current Ic.

According to the second embodiment, the load driving apparatus is configured to prevent the error caused by the current IQ1 flowing through the first switching element 35. Specifically, as shown in FIG. 4, the first switching element 35 and the second switching element 50 are connected together in a Darlington configuration in such a manner that the current IQ1 flowing through the first switching element 35 is added to the current IQ2 flowing through the second switching element 50 to form the constant current Ic.

More specifically, the fifth terminal 31e is connected to the load 10 and the drain of the second switching element 50 so that the drain of the first switching element 35 can be connected to the drain of the second switching element 50. Thus, the current IQ1 flowing through the first switching element 35 is added to the current IQ2 flowing through the second switching element 50 to form the constant current Ic. That is, the constant current Ic is given as follows: Ic=IQ1+IQ2=Vref/Rout.

In such an approach, the current IQ1 flowing through the first switching element 35 by way of the shunt resistor 20 and the second resistor 60 is used to form the constant currant Ic. Thus, accuracy of the constant current Ic supplied to the load 10 can be improved.

Third Embodiment

A load driving apparatus according to a third embodiment of the present invention is described below with reference to FIGS. 5A-5C. A difference of the third embodiment from the preceding embodiments is that a constant current source 36 instead of the first resistor 33 is connected to the gate of the first switching element 35.

Figures 5A, 5B:
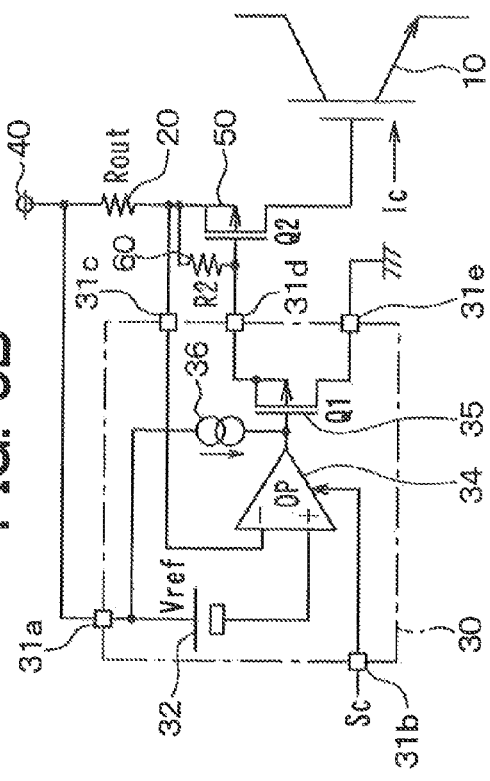
FIGS. 5A-5C are circuit diagrams of a load driving apparatus according to a third embodiment of the present invention.
Figure 5C:
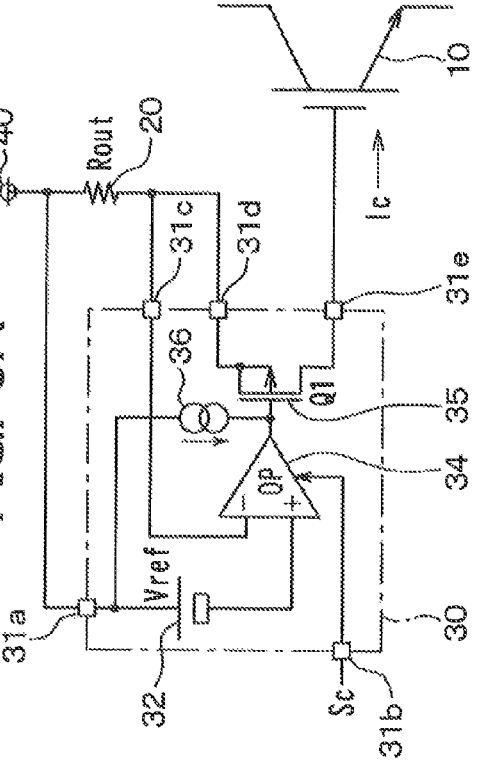

Specifically, as shown in FIG. 5A, the constant current source 36 is connected between the positive terminal of the reference voltage source 32 and a node between the output terminal of the operational amplifier 34 and the gate of the first switching element 35. A current flowing through the constant current source 36 flows from the positive terminal of the reference voltage source 32 to the node between the output terminal of the operational amplifier 34 and the gate of the first switching element 35. In FIG. 5A, the constant current source 36 is a separate piece from the operational amplifier 34. Alternatively, the constant current source 36 can be incorporated in the operational amplifier 34.

When the first resistor 33 is connected to the gate of the first switching element 35, the rate of increase in the gate voltage of the first switching element 35 depends on the time constant CR. Therefore, an overshoot in the gate voltage of the first switching element 35 may occur, and an increase in noise may occur. To avoid such disadvantages, according to the third embodiment, the constant current source 36 is used instead of the first resistor 33. Since a constant current is supplied from the constant current source 36 to the gate of the first switching element 35, the rate of increase in the gate voltage of the first switching element 35 can be kept constant. Thus, the overshoot in the gate voltage of the first switching element 35 and the increase in noise can be prevented.

The load driving apparatus of FIG. 5A can be modified as shown in FIG. 5B, in which the second switching element 50 and the second resistor 60 are added. Further, the load driving apparatus of FIG. 5B can be modified as shown in FIG. 5C, in which the first switching element 35 and the second switching element 50 are connected together in a Darlington configuration in such a manner that the current IQ1 flowing through the first switching element 35 is added to the current IQ2 flowing through the second switching element 50 to form the constant current Ic.

Fourth Embodiment

A load driving apparatus according to a fourth embodiment of the present invention is described below with reference to FIGS. 6A-6C. A difference of the fourth embodiment from the preceding embodiments is that the first switching element 35 is a PNP bipolar transistor instead of a P-channel power MOSFET.

Specifically, as shown in FIG. 6A, the base of the first switching element 35 is connected to the output terminal of the operational amplifier 34, the emitter of the first switching element 35 is connected to the fourth terminal 31d, and the collector of the first switching element 35 is connected to the fifth terminal 31e.

The load driving apparatus of FIG. 6A can be modified as shown in FIG. 6B, in which the second switching element 50, which is a PNP bipolar transistor, and the second resistor 60 are added. The base of the second switching element 50 is connected to the fourth terminal 31d, the emitter of the second switching element 50 is connected to the first end of the shunt resistor 20, and the collector of the second switching element 50 is connected to the load 10.

Further, the load driving apparatus of FIG. 6B can be modified as shown in FIG. 6C, in which the first switching element 35 and the second switching element 50, which are PNP bipolar transistors, are connected together in a Darlington configuration in such a manner that the current IQ1 flowing through the first switching element 35 is added to the current IQ2 flowing through the second switching element 50 to form the constant current Ic.

As described above, according to the fourth embodiment, the first switching element 35 and the second switching element 50 are PNP bipolar transistors instead of P-channel power MOSFETs. In such an approach, the costs of the first switching element 35 and the second switching element 50 can be reduced.

Fifth Embodiment

A load driving apparatus according to a fifth embodiment of the present invention is described below with reference to FIGS. 7A-7C. A difference of the fifth embodiment from the fourth embodiments is that the constant current source 36 instead of the first resistor 33 is connected to the gate of the first switching element 35. That is, the fifth embodiment corresponds to a combination of the third embodiment and the fourth embodiment.

As shown in FIG. 7A, the first resistor 33 of the load driving apparatus of FIG. 6A can be replaced with the constant current source 36. As shown in FIG. 7B, the first resistor 33 of the load driving apparatus of FIG. 6B can be replaced with the constant current source 36. As shown in FIG. 7C, the first resistor 33 of the load driving apparatus of FIG. 6C can be replaced with the constant current source 36.

Sixth Embodiment

A load driving apparatus according to a sixth embodiment of the present invention is described below with reference to FIG. 8. A difference of the sixth embodiment from the preceding embodiments is as follows. According to the preceding embodiments, the load driving apparatus causes the constant current Ic to flow to the gate of the load 10. In contrast, according to the sixth embodiment, the load driving apparatus causes the constant current Ic to flow in a reverse direction.

When the load 10 is an IGBT, the flow of the constant current Ic to the gate of the load 10 can turn ON the load 10, and the flow of the constant current Ic in the reverse direction can turn OFF the load 10. That is, according to the sixth embodiment, the load driving apparatus is configured to turn OFF the load 10.

Figure 8:
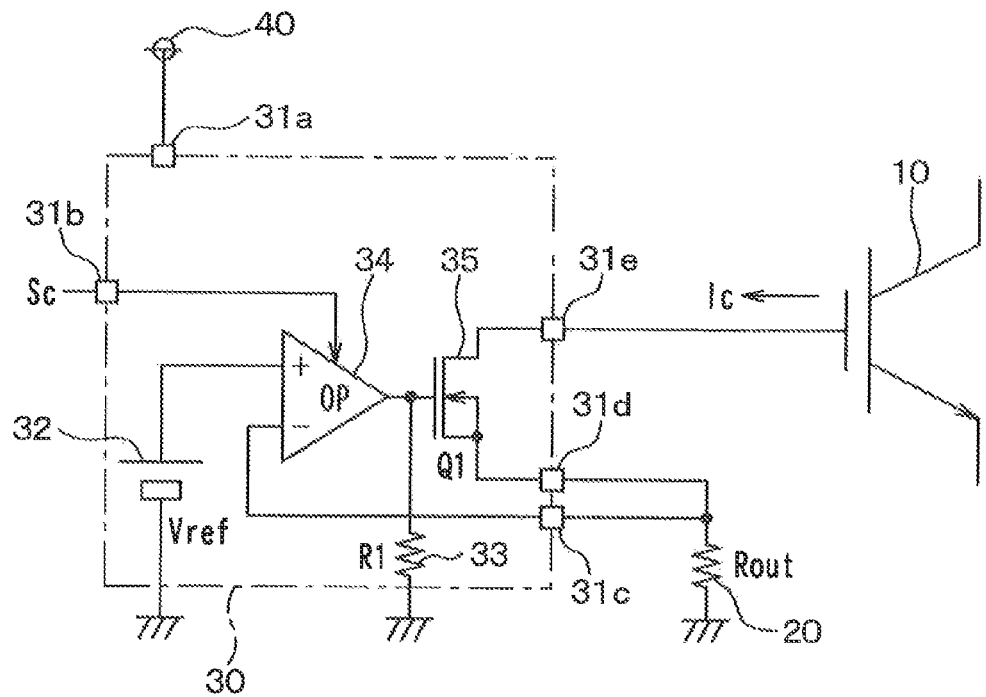
FIG. 8 is a circuit diagram of a load driving apparatus according to a sixth embodiment of the present invention.

As can be seen by comparing FIG. 1 and FIG. 8, the load driving apparatus of the sixth embodiment is configured in the same manner as the load driving apparatus of the first embodiment except that the polarity is reversed.

Specifically, as shown in FIG. 8, the power source 40 is connected to the first terminal 31a so that the driver circuit 30 can be powered by the power source 40. The non-inverting input terminal (+) of the operational amplifier 34 is connected to the positive terminal of the reference voltage source 32, and the negative terminal of the reference voltage source 32 is connected to the reference potential. The non-inverting input terminal (+) of the operational amplifier 34 is connected through the third terminal 31c to the first end of the shunt resistor 20. The second end of the shunt resistor 20 is connected to the reference potential.

The first end of the first resistor 33 is connected to the reference potential, and the second end of the first resistor 33 is connected to the output terminal of the operational amplifier 34.

According to the fifth embodiment, the first switching element 35 is an N-channel power MOSFET. The gate of the first switching element 35 is connected to the output terminal of the operational amplifier 34, and the source of the first switching element 35 is connected through the fourth terminal 31d to the first end of the shunt resistor 20. Further, the drain of the first switching element 35 is connected through the fifth terminal 31e to the load 10.

Like the first embodiment, the control signal Sc is inputted from the external circuit to the operational amplifier 34 through the second terminal 31b.

The load driving apparatus of FIG. 8 operates as follows to turn OFF the load 10 that is fully ON. When the control signal Sc is inputted to the driver circuit 30, the operational amplifier 34 turns ON the first switching element 35 so that a current path from the load 10 to the reference potential through the first switching element 35 and the shunt resistor 20 can be created. Thus, the constant current Ic flows from the gate of the load 10.

When the constant current Ic flows from the gate of the load 10, the gate voltage of the load 10 decreases at a rate depending on the magnitude of the constant current Ic. Assuming that the constant current Ic shown in FIG. 2 flows in a positive direction, the constant current Ic flowing from the load 10 flows in a negative direction. Then, the gate voltage of the load 10 reaches the mirror voltage Vmirror and is kept constant at the mirror voltage Vmirror during the mirror period. Then, when the mirror period elapses, the gate voltage of the load 10 starts to decrease again. Then, when the gate voltage of the load 10 reaches the threshold voltage Vt of the load 10, the load 10 is turned OFF.

In this way, even when the constant current Ic flows from the load 10, the driver circuit 30 performs the feedback-control of the current flowing through the shunt resistor 20 in such a manner that the first voltage corresponding to the reference voltage Vref of the reference voltage source 32 can become equal to the second voltage corresponding to the voltage at the first end of the shunt resistor 20. In other words, since the constant current Ic is given as follows: Ic=Vref/Rout, the operational amplifier 34 controls the gate of the first switching element 35 to satisfy the following equation: Vref=Rout×Ic.

As described above, according to the sixth embodiment, the load driving apparatus is configured to turn OFF the load 10. When the load 10 is an IGBT, both the load driving apparatus of FIG. 1 and the load driving apparatus of FIG. 8 can be connected to the load 10 so that the load 10 can be turned ON and OFF.

Figure 9:
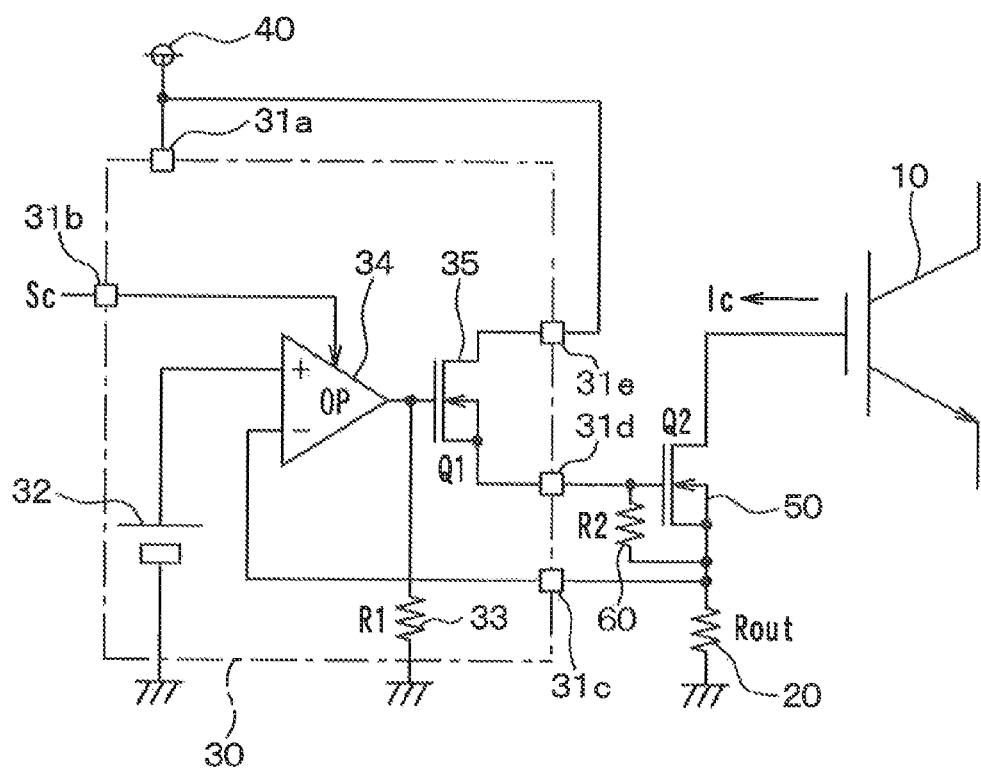
FIG. 9 is a circuit diagram of a load driving apparatus according to a modification of the sixth embodiment.

The load driving apparatus of FIG. 8 can be modified as shown in FIG. 9, in which the second switching element 50, which is an N-channel power MOSFET, and the second resistor 60 are added.

As shown in FIG. 9, the first end of the shunt resistor 20 is connected to the third terminal 31c of the driver circuit 30 and the second switching element 50.

The gate of the second switching element 50 is connected to the fourth terminal 31d and electrically connected through the fourth terminal 31d to the source of the first switching element 35. The source of the second switching element 50 is connected to the first end of the shunt resistor 20. Further, the drain of the second switching element 50 is connected to the load 10. That is, the first switching element 35 and the second switching element 50 are connected together in a Darlington configuration.

The first end of the second resistor 60 is connected to the gate of the second switching element 50, and the second end of the second resistor 60 is connected to the source of the second switching element 50.

Due to the second switching element 50, the current capability of the load driving apparatus of FIG. 9 is higher than that of the load driving apparatus of FIG. 8. The load driving apparatus of FIG. 9 operates in the same manner as the load driving apparatus of FIG. 8.

Specifically, when the operational amplifier 34 turns ON the first switching element 35 in response to the control signal Sc, a current flows from the power source 40 to the gate of the second switching element 50 through the first switching element 35 so that the gate voltage of the second switching element 50 increases. Then, the second switching element 50 is turned ON so that a current path from the load 10 to the reference potential through the second switching element 50 and the shunt resistor 20 can be created. Thus, the current flowing through the shunt resistor 20 is feedback-controlled, and the constant current Ic flows from the gate of the load 10.

Specifically, the driver circuit 30 drives the second switching element 50 by driving the first switching element 35 in such a manner that the first voltage and the second voltage become equal to each other. Thus, the magnitude of the current flowing through the shunt resistor 20 is feedback-controlled so that the magnitude of the constant current Ic flowing from the load 10 can be adjusted.

As described above, since the addition of the second switching element 50 improves the current capability of the load driving apparatus, the load driving apparatus can supply a larger constant current Ic to the load 10.

Seventh Embodiment

A load driving apparatus according to a seventh embodiment of the present invention is described below with reference to FIG. 10. A difference of the seventh embodiment from the sixth embodiment is as follows. According to the seventh embodiment, like the second embodiment, the load driving apparatus is configured to prevent the error caused by the current IQ1 flowing through the first switching element 35.

Figure 10:
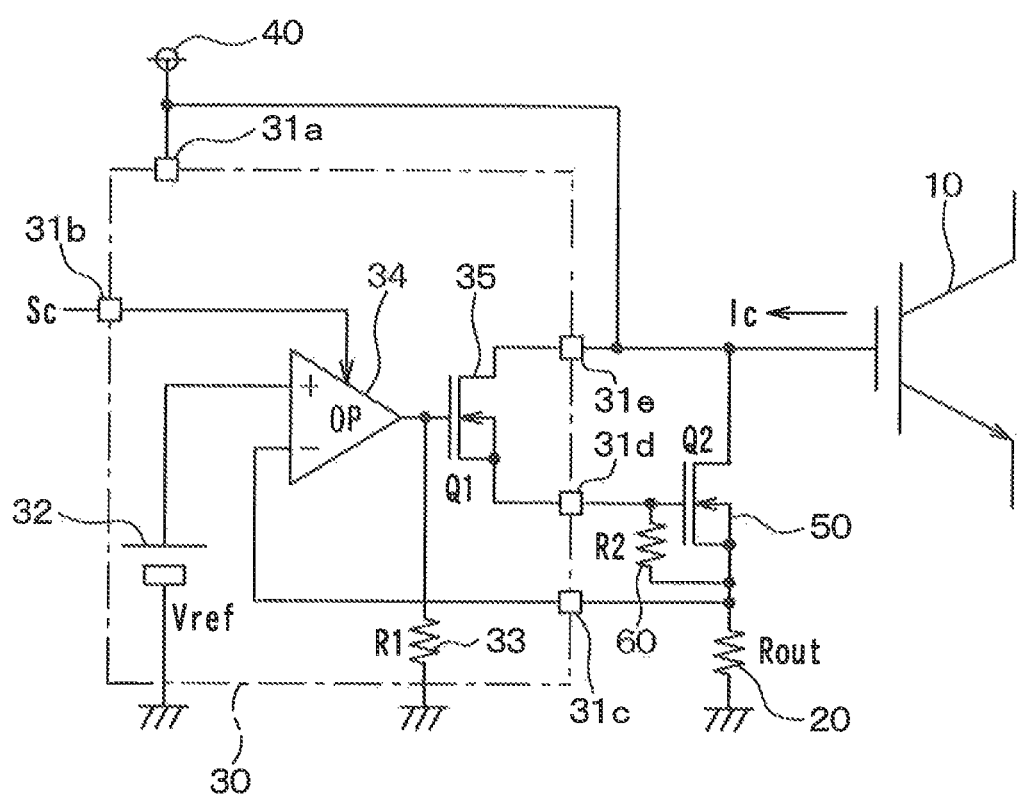
FIG. 10 is a circuit diagram of a load driving apparatus according to a seventh embodiment of the present invention.

Specifically, as shown in FIG. 10, the fifth terminal 31e is connected to the drain of the second switching element 50 and the load 10. Thus, the constant current Ic flowing from the load 10 is divided into the current IQ1 flowing through the first switching element 35 and the current IQ2 flowing through the second switching element 50, and then the current IQ1 and the current IQ2 are joined to form the current flowing through the shunt resistor 20. Thus, accuracy of the constant current Ic can be improved.

Eighth Embodiment

A load driving apparatus according to a eighth embodiment of the present invention is described below with reference to FIG. 11

Figure 11:
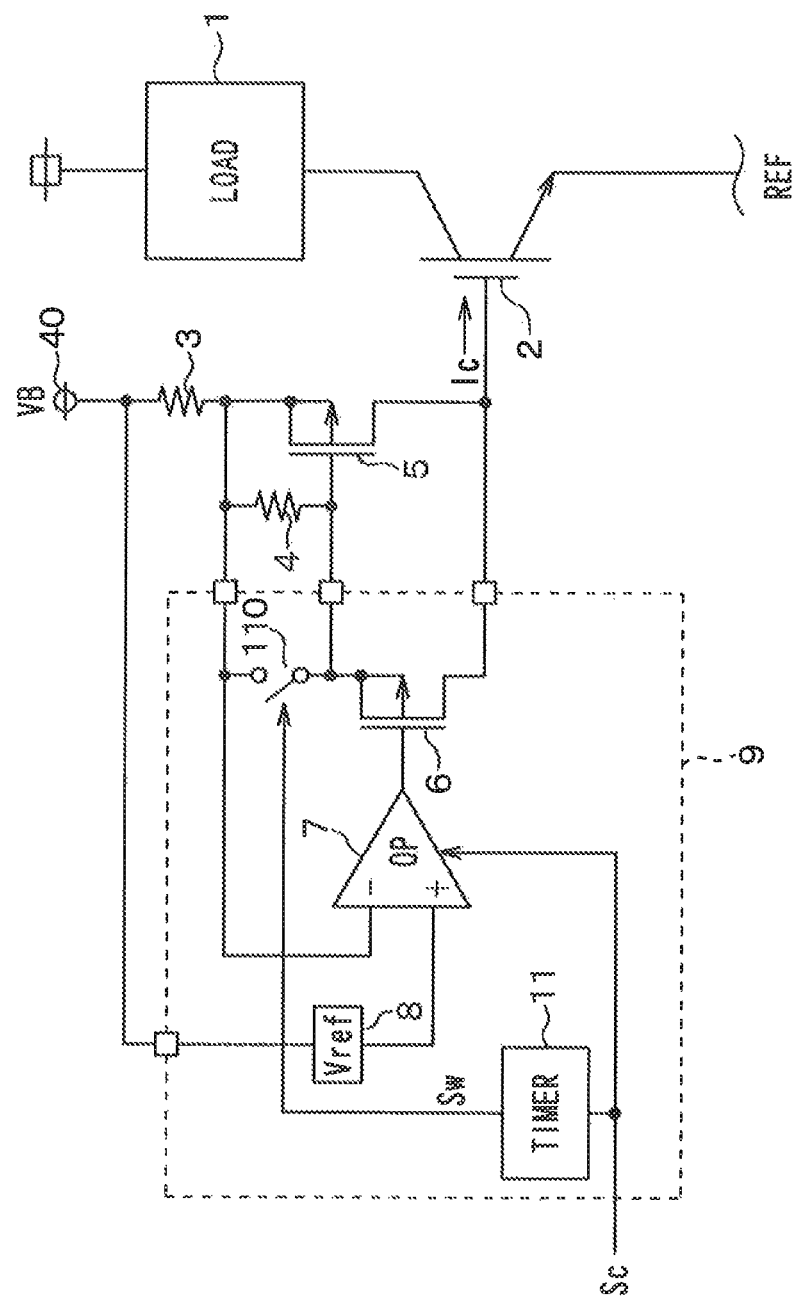
FIG. 11 is a circuit diagram of a load driving apparatus according to an eighth embodiment of the present invention.

As shown in FIG. 11, the load driving apparatus includes a switching device 2 connected between a load 1 and a predetermined reference potential REF such as ground. The load driving apparatus further includes an ON-side driver circuit for turning ON the switching device 2 to supply power to the load 1. The ON-side driver circuit includes a first resistor 3, a second resistor 4 as a pull-up member, a first P-channel MOSFET 5, a second P-channel MOSFET 6, an operational amplifier 7, and a reference voltage source 8. The first resistor 3, the second resistor 4, the first P-channel MOSFET 5, and the second P-channel MOSFET 6 are connected to form a Darlington circuit. The reference voltage source 8 generates a predetermined reference voltage Vref. In an example shown in FIG. 11, the Darlington circuit includes two transistors 5, 6. The number of transistors included in the Darlington circuit is not limited to two. The Darlington circuit can include more than two transistors.

The load 1 is driven by the power that is supplied based on a switching operation of the switching device 2. The load 1 is not limited to a specific device. For example, when the load driving apparatus has multiple switching devices 2 that are connected to form an inverter circuit, the load 1 can be a three-phase motor.

The switching device 2 is constructed with a semiconductor switching element such as an IGBT, a MOSFET, or the like. According to the eighth embodiment, the switching device 2 is an IGBT. The switching device 2 is driven based on a constant current Ic supplied from a Darlington circuit.

The Darlington circuit controls the switching device 2 by controlling the constant current Ic flowing to the switching device 2 so that the power supply to the load 1 can be controlled. Specifically, the Darlington circuit supplies the constant current Ic as a drive current to the switching device 2 in order to turn ON the switching device 2 so that the power supply to the load 1 can be turned ON. In the Darlington circuit, heat is produced when the switching device 2 is driven. As a measure against the heat, according to the eighth embodiment, the Darlington circuit is partially constructed with discrete components. Specifically, a part of the Darling circuit enclosed by a broken line in FIG. 11 is implemented in a single IC chip 9. Thus, the second P-channel MOSFET 6 and the operational amplifier 7 are incorporated in the IC chip 9. On the other hand, the first resistor 3, the second resistor 4, and the first P-channel MOSFET 5 are discrete components separate from the IC chip 9.

The first resistor 3 is connected between the power source 40 and the source of the first P-channel MOSFET 5. The first resistor 3 is used as a sensing resistor when generating the constant current Ic. According to the eighth embodiment, a current corresponding to the constant current Ic supplied to the gate of the switching device 2 flows through the first resistor 3. For example, assuming that the reference voltage Vref of the reference voltage source 8 is one volt, an input voltage to the operational amplifier 7 is (VB−1) volts, and the current flowing through the first resistor 3 is one ampere, the first resistor 3 has a resistance of one ohm (1Ω).

The second resistor 4 is used as a pull-up member and connected between the gate of the first P-channel MOSFET 5 and the source of the second P-channel MOSFET 6. Further, according to the eighth embodiment, the second resistor 4 is connected between the gate and the source of the first P-channel MOSFET 5 to generate a gate-source voltage of the first P-channel MOSFET 5. The second resistor 4 is used to drive the first P-channel MOSFET 5. Therefore, as a measure against heat generation, a resistance of the second resistor 4 is sufficiently greater than the resistance of the first resistor 3. For example, the second resistor 4 can have a resistance of one hundred ohms (100Ω).

The gate of the first P-channel MOSFET 5 is connected to the second resistor 4, the source of the first P-channel MOSFET 5 is connected to the first resistor 3, and the drain of the first P-channel MOSFET 5 is connected to the gate of the switching device 2. A current capability of the first P-channel MOSFET 5 is higher than a current capability of the second P-channel MOSFET 6. Specifically, the first P-channel MOSFET 5 is implemented in a chip (i.e., discrete component) separate from the IC chip 9 in which the second P-channel MOSFET 6 is implemented. A chip size of the first P-channel MOSFET 5 is larger than a chip size of the second P-channel MOSFET 6 so that the current flowing through the first P-channel MOSFET 5 can be larger than a current flowing through the second P-channel MOSFET 6.

The gate of the second P-channel MOSFET 6 is connected to an output terminal of the operational amplifier 7, the source of the second P-channel MOSFET 6 is connected to the second resistor 4 and the gate of the first P-channel MOSFET 5, and the drain of the second P-channel MOSFET 6 is connected to the drain of the first P-channel MOSFET 5 and the gate of the switching device 2.

The operational amplifier 7 is driven based on the control signal Sc and controls the supply of current though the Darlington circuit to the switching device 2. The operational amplifier 7 adjusts the magnitude of the constant current Ic supplied to the gate of the switching device 2 by performing a feedback-control of the current flowing through the first resistor 3 based on the reference voltage Vref of the reference voltage source 8. When the load 1 is to be driven, the control signal Sc is inputted to the IC chip 9 from the external circuit. In response to the control signal Sc, the operational amplifier 7 drives the load 1 by turning ON the switching device 2 through the Darlington circuit.

Specifically, a non-inverting input terminal (+) of the operational amplifier 7 is connected to the reference voltage source 8 so that a first voltage corresponding to the reference voltage Vref can be applied to the non-inverting input terminal (+) of the operational amplifier 7. According to the eighth embodiment, the first voltage is calculated by subtracting the reference voltage Vref from the power supply voltage VB. On the other hand, an inverting input terminal (−) of the operational amplifier 7 is connected to a node between the first resistor 3 and the second resistor 4, i.e., connected to the source of the first P-channel MOSFET 5. Thus, a second voltage at a negative side of the first resistor 3 is applied to the inverting input terminal (−) of the operational amplifier 7. According to the eighth embodiment, the second voltage is calculated by subtracting a voltage drop across the first resistor 3 from the power supply voltage VB. The operational amplifier 7 performs the feedback-control of the current flowing through the first resistor 3 by controlling the current supplied from the output terminal of the operational amplifier 7 to the gate of the second P-channel MOSFET 6 in such a manner that the first voltage inputted to the non-inverting input terminal (+) and the second voltage inputted to the inverting input terminal (−) can be equal to each other.

A basic operation of the load driving apparatus of FIG. 11 is as follows. When the control signal Sc is inputted to the load driving apparatus, the operational amplifier 7 turns ON the second P-channel MOSFET 6 so that a current can flow between the drain and the source of the second P-channel MOSFET 6 through the first resistor 3 and the second resistor 4. As a result, a voltage drop across the second resistor 4 occurs and is applied between the gate and the source of the first P-channel MOSFET 5. When the voltage drop across the second resistor 4, i.e., the gate-source voltage of the first P-channel MOSFET 5 becomes equal to or greater than a threshold voltage Vt of the first P-channel MOSFET 5 the first P-channel MOSFET 5 is turned ON so that a current can flow between the drain and the source of the first P-channel MOSFET 5. Thus, the constant current Ic flows to the gate of the switching device 2 through the first P-channel MOSFET 5 and the second P-channel MOSFET 6. In this way, when the control signal Sc is inputted to the load driving apparatus, the Darlington circuit is driven based on the output of the operational amplifier 7 so that the switching device 2 can be driven.

Since not only the drain of the first P-channel MOSFET but also the drain of the second P-channel MOSFET 6 are connected to the gate of the switching device 2, the current flowing through the second P-channel MOSFET 6 is used to drive the switching device 2. Thus, consumption current is reduced. Further, since a larger current is supplied to the switching device 2, the switching device 2 can be driven at a faster speed.

However, when the gate voltage of the switching device 2 increases and exceeds a value (VB−VR1−Vt) obtained by subtracting a voltage drop VR1 across the first resistor 3 and the threshold voltage Vt of the first P-channel MOSFET 5 from the power supply voltage VB of the power source 40, the first P-channel MOSFET 5 is turned OFF. When the first P-channel MOSFET 5 is turned OFF, the current is supplied to the gate of the switching device 2 through the first resistor 3, the second resistor 4, and the second P-channel MOSFET 6 so that the switching device 2 can be pulled up based on the first resistor 3, the second resistor 4, and an ON-resistance of the second P-channel MOSFET 6. As mentioned previously, the resistance of the second resistor 4 is set sufficiently greater than the resistance of the first resistor 3 as a measure against heat generation. Theretofore, when the switching device 2 is pulled up, the driving speed of the switching device 2 is much reduced. The reduction in the driving speed of the switching device 2 results in an increase in loss in the switching device 2.

To avoid such disadvantages, according to the eighth embodiment, the load driving apparatus includes a switch 110 and a timer 11. The switch 110 is connected between the gate and the source of the first P-channel MOSFET 5. In other words, the switch 110 is connected in parallel to the second resistor 4. The timer 11 generates a switching signal Sw for turning ON the switch 110.

The switch 110 connects and disconnects the gate (i.e., control terminal) of the first P-channel MOSFET 5 to and from the source (i.e., first terminal) of first terminal of the first P-channel MOSFET 5. Specifically, when the switch 110 is OFF, the current flows to the second P-channel MOSFET 6 through the second resistor 4. In contrast, when the switch 110 is ON, the current flows to the second P-channel MOSFET 6 through the second resistor 4 and the switch 110. Thus, when the switch 110 is ON, a resistance between the gate and the source of the first P-channel MOSFET 5 is given as a combined resistance of the second resistor 4 and an ON-resistance of the switch 110. Therefore, the resistance between the gate and the source of the first P-channel MOSFET 5 can be sufficiently reduced. Thus, when the switching device 2 is pulled up, the reduction in the driving speed of the switching device 2 can be reduced.

As shown in FIG. 11, the control signal Sc is inputted to not only the operational amplifier 7 but also the timer 11. The timer 11 outputs the switching signal Sw to the switch 110 after a predetermined elapsed time from when the control signal Sc is inputted to the timer 11. The time elapsed from when the gate voltage of the switching device 2 starts to increase due to the turn-ON of the switching device 2 to when the gate voltage of the switching device 2 becomes high enough to turn OFF the first P-channel MOSFET 5 can be estimated from characteristics of the switching device 2. The estimated time is set as the predetermined elapsed time from when the control signal Sc is inputted to the timer 11 to when the timer 11 outputs the switching signal Sw to the switch 110. In such an approach, when the switching device 2 is pulled up, the switch 110 is turned ON so that the resistance between the gate and the source of the first P-channel MOSFET 5 can be reduced.

Figure 12:
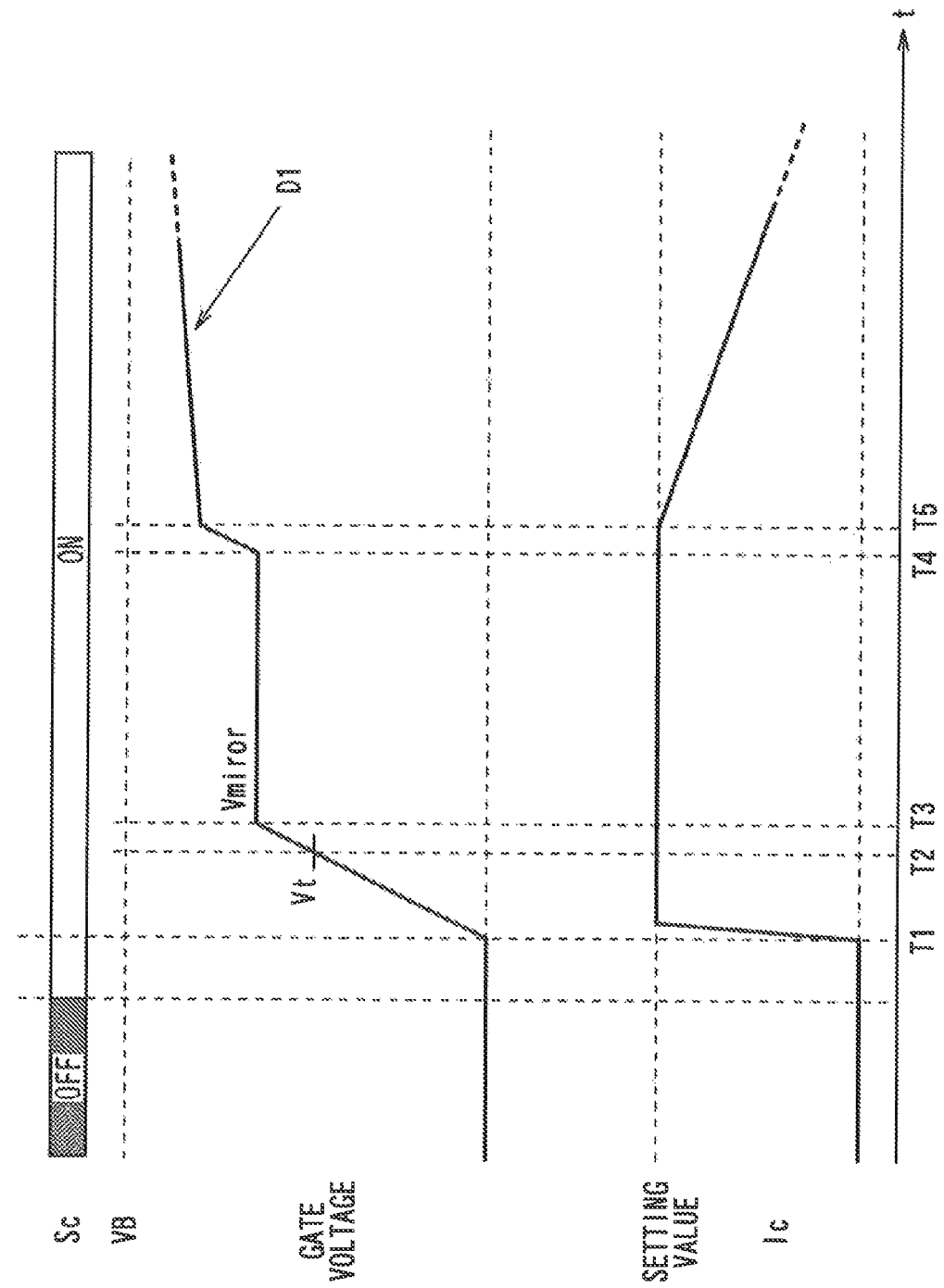
FIG. 12 is a timing diagram of the load driving apparatus of FIG. 11 in which a first switch is deactivated.
Figure 13:
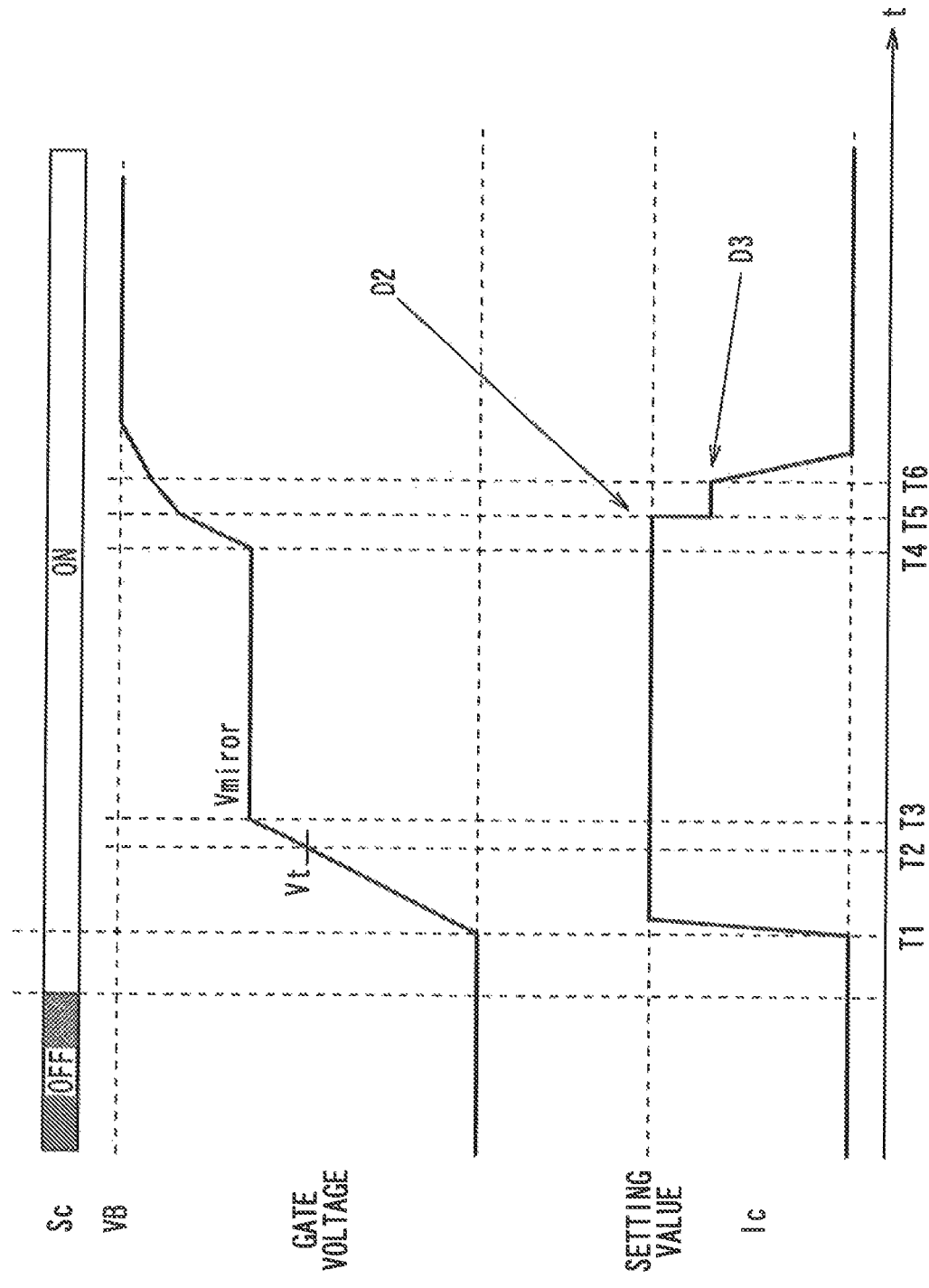
FIG. 13 is a timing diagram of the load driving apparatus of FIG. 11 in which the first switch is activated.

FIG. 12 is a timing diagram of the load driving apparatus of FIG. 11 in which the switch 110 is deactivated. FIG. 13 is a timing diagram of the load driving apparatus of FIG. 11 in which the switch 110 is activated.

As shown in FIGS. 12 and 13, the second P-channel MOSFET 6 is turned ON at a time T1 after the predetermined elapsed time from when the control signal Sc is inputted to the timer 11. Then, the first P-channel MOSFET 5 is turned ON. When the constant current Ic supplied to the switching device 2 increases and reaches a predetermined setting value, the constant current Ic is kept at the setting value. For the sake of simplicity, FIGS. 12 and 13 illustrate that the constant current Ic increases at a constant rate (gradient). Actually, the rate (gradient) of increase in the constant current Ic is different between when only the second P-channel MOSFET 6 is ON and when both the first P-channel MOSFET 5 and the second P-channel MOSFET 6 are ON. However, the time from when the second P-channel MOSFET 6 is turned ON to when the first P-channel MOSFET 5 is turned ON is very short.

As the constant current Ic flows to the gate of the switching device 2, the gate voltage of the switching device 2 increases and exceeds a threshold voltage Vt of the switching device 2 at a time T2. Then, the gate voltage of the switching device 2 reaches the mirror voltage Vmirror at a time T3 and is kept at the mirror voltage Vmirror for the mirror period. Then, the gate voltage of the switching device 2 starts to increase again at a time T4 when the mirror period elapses.

Then, when the gate voltage of the switching device 2 exceeds the value (VB−VR1−Vt) obtained by subtracting the voltage drop VR1 across the first resistor 3 and the threshold voltage Vt of the first P-channel MOSFET 5 from the power supply voltage VB at a time T5, the first P-channel MOSFET 5 is turned OFF so that the switching device 2 can be pulled up.

In this case, as shown in FIG. 12, if the switch 110 is deactivated, i.e., if the load driving apparatus does not have a mechanism for reducing the resistance between the gate and the source of the first P-channel MOSFET 5, the driving speed of the switching device 2 is much reduced when the switching device 2 is pulled up. That is, when the gate voltage of the switching device 2 exceeds the value (VB−VR1−Vt) as indicated by an arrow D1 in FIG. 12, the driving speed of the switching device 2 is much reduced.

In contrast, as shown in FIG. 13, when the switch 110 is activated, the resistance between the gate and the source of the first P-channel MOSFET 5 can be reduced. Therefore, when the switching device 2 is pulled up, the reduction in the driving speed of the switching device 2 can be reduced.

Specifically, when the switch 110 is activated, the load driving apparatus operates as follows after the time T5. During a time period from the time T5 to a time T6, the first P-channel MOSFET 5 is OFF, and the current supply to the gate of the switching device 2 is performed through only the second P-channel MOSFET 6. Therefore, the constant current Ic is reduced depending on the current capability of the second P-channel MOSFET 6 as indicated by an arrow D2 in FIG. 13. Therefore, the rate (gradient) of increase in the gate voltage of the switching device 2 is smaller during the time period from the time 15 to the time T6 than during the time period from the time T4 to the time T5. Then, after the time T6, the voltage between the drain and the source of the second P-channel MOSFET 6 decreases with the increase in the gate voltage of the switching device 2. Then, as in indicated by an arrow D3 in FIG. 13, the switching device 2 is pulled up based on the ON-resistance of the second P-channel MOSFET 6 and a combined resistance of the first resistor 3, the second resistor 4, and the switch 110. In this case, since the switch 110 is turned ON so that the resistance between the gate and the source of the first P-channel MOSFET 5 can be reduced, the reduction in the driving speed of the switching device 2 can be reduced.

As described above, according to the eighth embodiment, the switching device 2 is driven by the Darlington circuit constructed with the first P-channel MOSFET 5 and the second P-channel MOSFET 6. The drains of the first P-channel MOSFET 5 and the second P-channel MOSFET 6 are connected to the gate of the switching device 2. In such an approach, not only the current flowing though the first P-channel MOSFET but also the current flowing through the second P-channel MOSFET 6 can be used to drive the switching device 2. Thus, consumption current is reduced. Further, since the switching device 2 is driven by a larger current, the switching device 2 can be driven at a faster speed.

Further, according to the eighth embodiment, the switch 110 is connected in parallel to the second resistor 4 that is connected between the gate and the source of the first P-channel MOSFET 5 of the Darlington circuit. When the switching device 2 is pulled up, the switch 110 is turned ON so that the resistance between the gate and the source of the first P-channel MOSFET 5 can be reduced. In such an approach, when the switching device 2 is pulled up, the reduction in the driving speed of the switching device 2 can be reduced.

Ninth Embodiment

A load driving apparatus according to a ninth embodiment of the present invention is described below with reference to FIG. 14. A difference between the eighth embodiment and the ninth embodiment is as follows.

Figure 14:
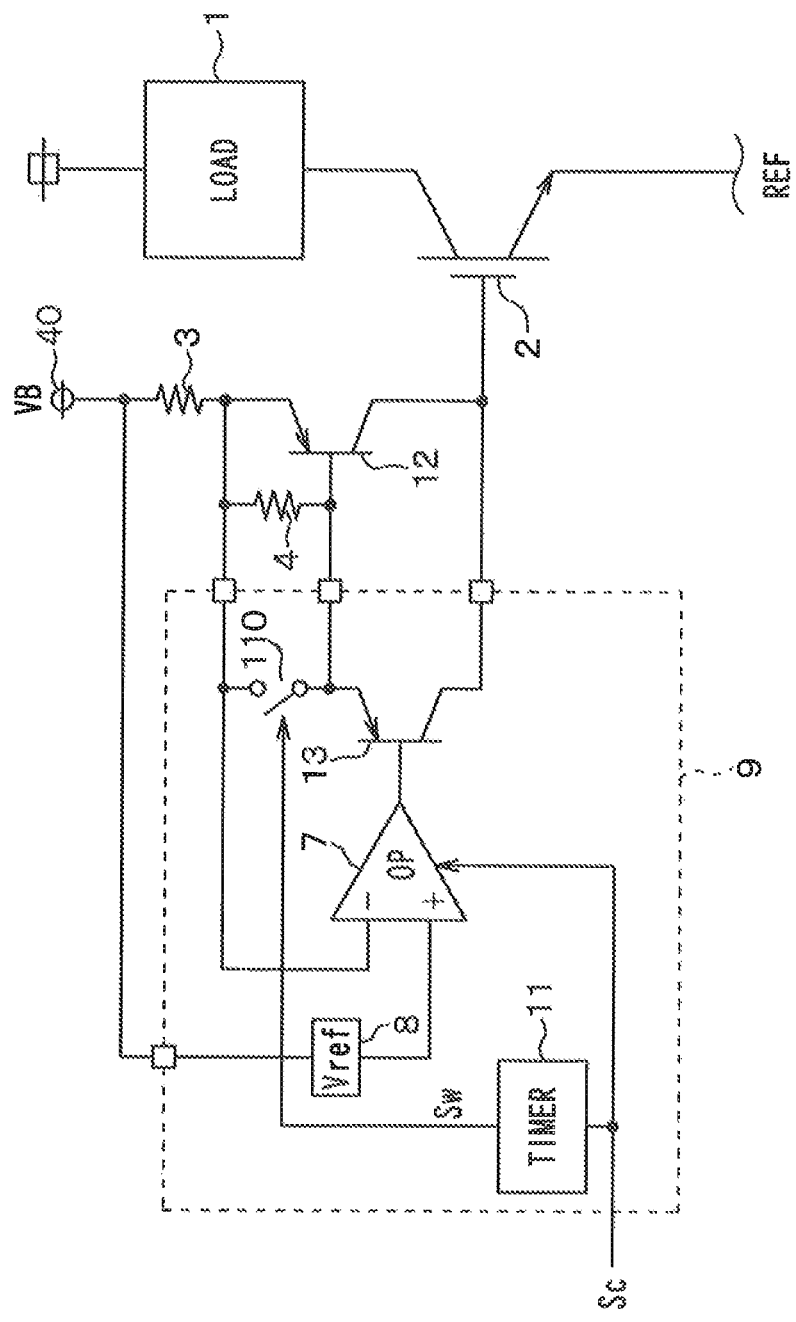
FIG. 14 is a circuit diagram of a load driving apparatus according to a ninth embodiment of the present invention.

As shown in FIG. 14, according to the ninth embodiment, the Darlington circuit is constructed with a first PNP transistor 12 and a second PNP transistor 13 instead of the first P-channel MOSFET 5 and the second P-channel MOSFET 6. The second resistor 4 is connected between the base and the emitter of the first PNP transistor 12. The switch 110 is connected between the base and the emitter of the first PNP transistor 12.

As described above, according to the ninth embodiment, the Darlington circuit of the ON-side driver circuit is constructed with PNP transistors instead of P-channel MOSFETs. Even in such a case, the load driving apparatus can operate in the same manner as the eighth embodiment so that the same advantages as the eighth embodiment can be obtained.

Tenth Embodiment

A load driving apparatus according to a tenth embodiment of the present invention is described below with reference to FIG. 15. A difference of the tenth embodiment from the eighth embodiment is that the load driving apparatus has an OFF-side driver circuit for turning OFF the switching device 2 instead of the ON-side driver circuit.

The OFF-side driver circuit is configured in almost the same manner as the ON-side driver circuit of the eighth embodiment. In the OFF-side driver circuit, the Darlington circuit is connected between the gate of the switching device 2 and the reference potential REF such as ground. Specifically, the Darlington circuit is connected between the gate of the switching device 2 and the reference potential REF to which the emitter (i.e., second terminal) of the switching device 2 is connected. The non-inverting input terminal (+) of the operational amplifier 7 is connected through the reference voltage source 8 to the reference potential REF. The Darlington circuit includes a first N-channel MOSFET 14 and a second N-channel MOSFET 15. The second resistor 4 is connected between the gate and the source of the first N-channel MOSFET 14. The switch 110 is connected in parallel with the second resistor 4.

In the OFF-side driver circuit, the constant current is feedback-controlled based on the reference voltage Vref as the first voltage and the voltage drop VR1 across the first resistor 3 as the second voltage.

As described above, according to the tenth embodiment, the load driving apparatus includes the OFF-side driver circuit for tuning OFF the switching device. The OFF-side driver circuit of the tenth embodiment operates in an opposite manner as the ON-side driver circuit of the eighth embodiment shown in FIG. 13. The time elapsed from when the gate voltage of the switching device 2 starts to decrease due the turn-OFF of the switching device 2 to when the gate voltage of the switching device 2 becomes low enough to turn OFF the first N-channel MOSFET 14 can be estimated from characteristics of the switching device 2. The estimated time is set as the predetermined elapsed time from when the control signal Sc is inputted to the timer 11 to when the timer 11 outputs the switching signal Sw to the switch 110. In such an approach, when the switching device 2 is pulled OFF, the switch 110 is turned ON so that the resistance between the gate and the source of the first N-channel MOSFET 14 can be reduced. Thus, the reduction in the driving speed of the switching device 2 can be reduced, when the switching device 2 is pulled OFF.

Eleventh Embodiment

A load driving apparatus according to a eleventh embodiment of the present invention is described below with reference to FIG. 16. A difference of the eleventh embodiment from the tenth embodiment is as follows.

Figure 16:
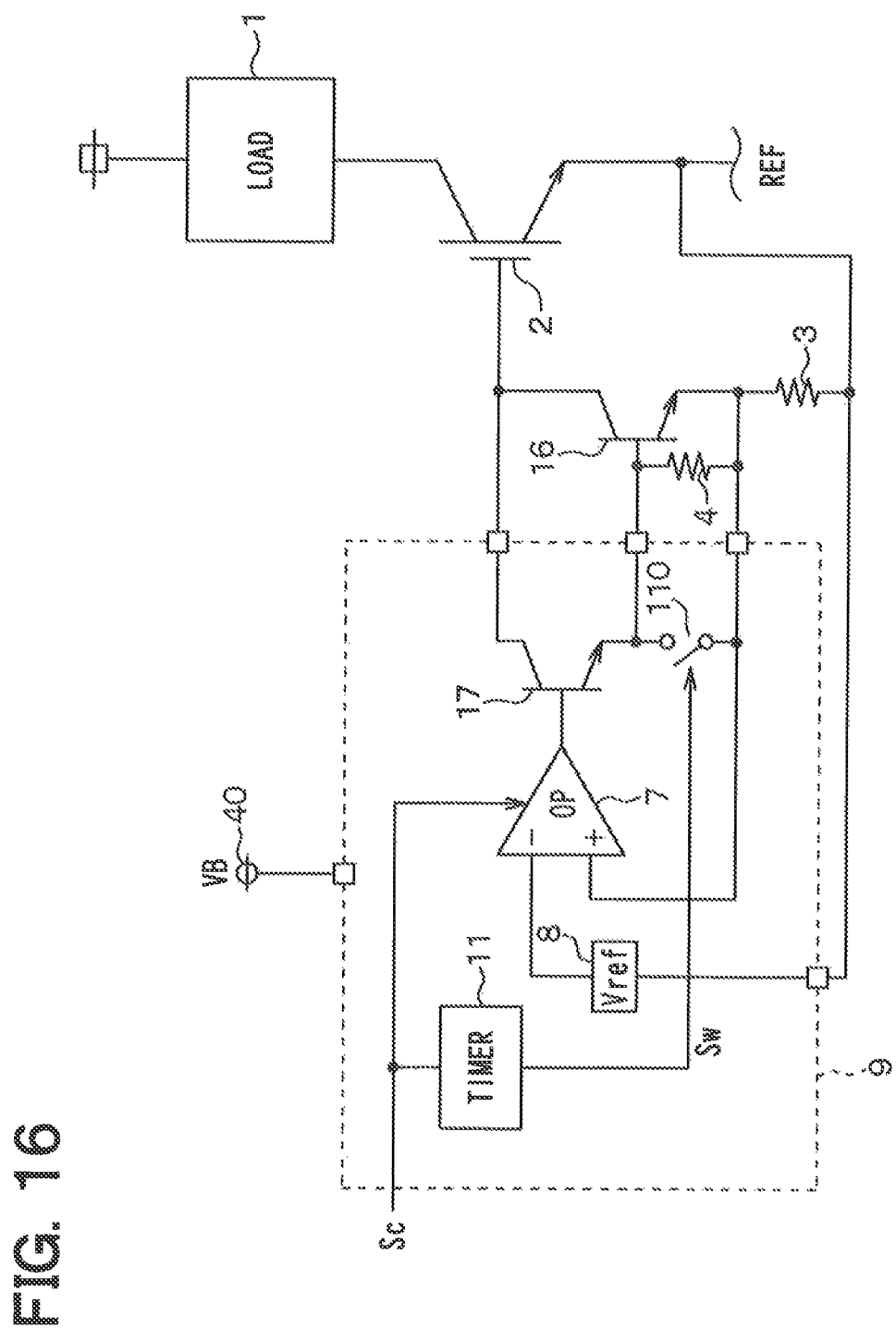
FIG. 16 is a circuit diagram of a load driving apparatus according to a eleventh embodiment of the present invention.

As shown in FIG. 16, according to the eleventh embodiment, the Darlington circuit is constructed with a first NPN transistor 16 and a second NPN transistor 17 instead of the first N-channel MOSFET 14 and the second N-channel MOSFET 15. The second resistor 4 is connected between the base and the emitter of the first NPN transistor 16. Likewise, the switch 110 is connected between the base and the emitter of the first NPN transistor 16.

As described above, according to the eleventh embodiment, the Darlington circuit of the OFF-side driver circuit is constructed with NPN transistors instead of N-channel MOSFETs. Even in such a case, the load driving apparatus can operate in the same manner as the tenth embodiment so that the same advantages as the tenth embodiment can be obtained.

Twelfth Embodiment

A load driving apparatus according to a twelfth embodiment of the present invention is described below with reference to FIG. 17. A difference of the twelfth embodiment from the preceding embodiments is as follows. In the preceding embodiments, the timer 11 outputs the switching signal Sw to the switch 110 after the predetermined elapsed time from when the control signal Sc is inputted to the timer 11. In contrast, in the twelfth embodiment, the switching signal Sw is outputted to the switch 110 based on the voltage of the gate (i.e., control terminal) of the switching device 2.

Figure 17:
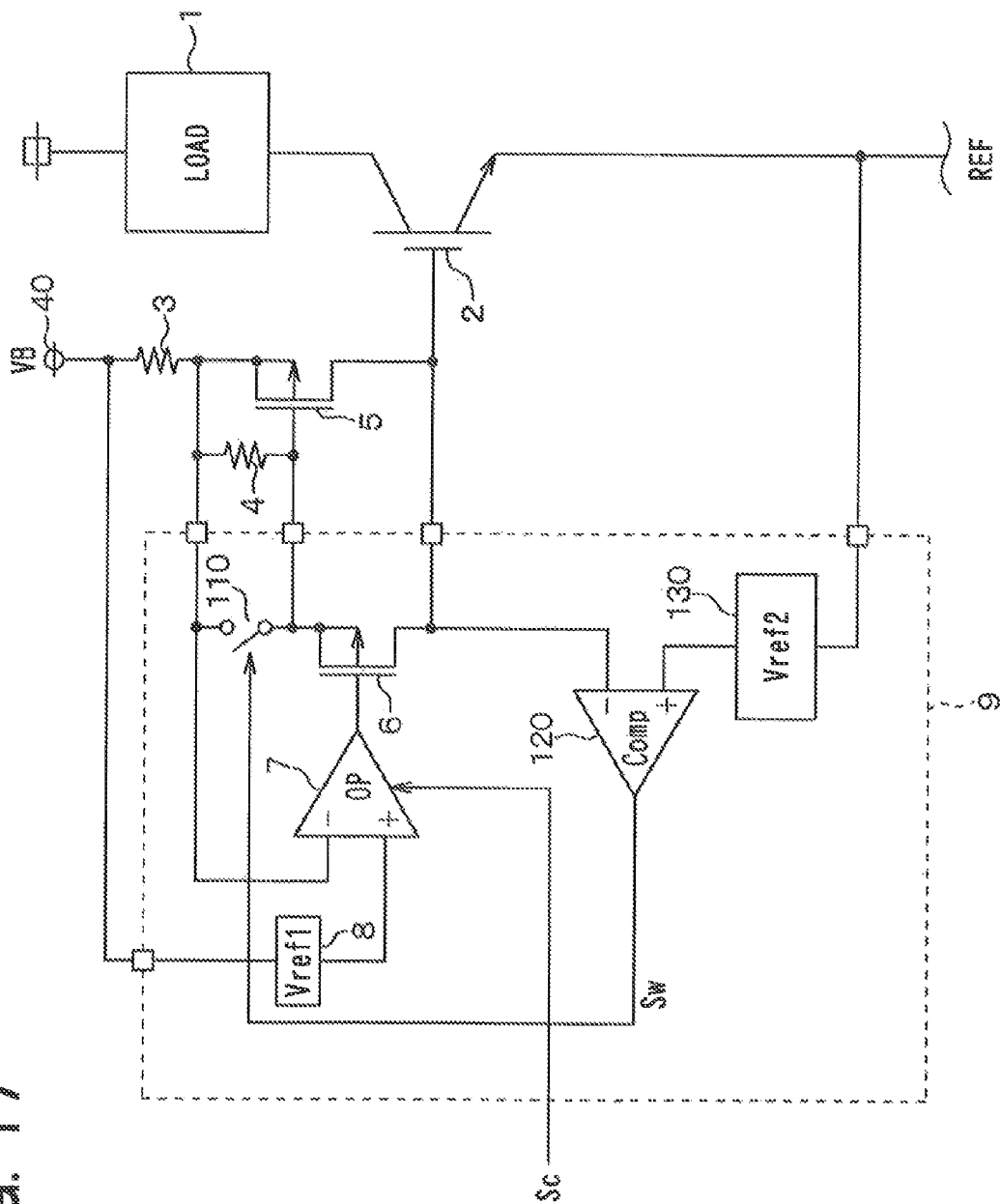
FIG. 17 is a circuit diagram of a load driving apparatus according to a twelfth embodiment of the present invention.

As shown in FIG. 17, according to the twelfth embodiment, the load driving apparatus includes a switching signal generator instead of the timer 11. The switching signal generator is constructed with a comparator 120 and a reference voltage source 130 separate from the reference voltage source 8. The reference voltage source 8 generates a predetermined reference voltage Vref1, and the first reference voltage Vref1 is inputted to the non-inverting input terminal (+) of the operational amplifier 7. The reference voltage source 130 generates a predetermined reference voltage Vref2, and the reference voltage Vref2 is inputted to a non-inverting input terminal (+) of the comparator 120. The gate voltage of the switching device 2 is inputted to an inverting input terminal (−) of the comparator 120. The comparator 120 performs a comparison between the reference voltage Vre2 and the gate voltage of the switching device 2 and outputs the switching signal Sw to the switch 110 based on a result of the comparison. Specifically, when the gate voltage of the switching device 2 exceeds the reference voltage Vref2, the comparator 120 outputs the switching signal Sw to the switch 110. It is noted that when the gate voltage of the switching device 2 exceeds the reference voltage Vref2, the first P-channel MOSFET 5 is turned OFF.

As described above, according to the twelfth embodiment, the load driving apparatus includes the switching signal generator for outputting the switching signal Sw to the switch 110 based on the voltage of the gate (e.g., control terminal) of the switching device 2. Specifically, the switching signal Sw is outputted to the switch 110, when the gate voltage of the switching device 2 exceeds the reference voltage Vref2. The reference voltage Vref2 is determined in such a manner that when the gate voltage of the switching device 2 exceeds the reference voltage Vref2, the first P-channel MOSFET 5 is turned OFF. Even in such an approach, the same advantages as the preceding embodiments can be obtained.

In FIG. 17, the switching signal generator is added to the load driving apparatus of the eighth embodiment. Likewise, the switching signal generator can be added to the load driving apparatus of any one of the ninth to eleventh embodiments.

Thirteenth Embodiment

A load driving apparatus according to a thirteenth embodiment of the present invention is described below with reference to FIG. 18. A difference of the thirteenth embodiment from the twelfth embodiment is as follows. In the twelfth embodiment, the switching signal generator outputs the switching signal Sw to the switch 110 based on the voltage of the gate (i.e., control terminal) of the switching device 2. In contrast, in the thirteenth embodiment, the switching signal generator outputs the switching signal Sw to the switch 110 based on the voltage between the drain (i.e., first terminal) and the source (i.e., second terminal) of the first P-channel MOSFET 5 (i.e., first transistor).

Figure 18:
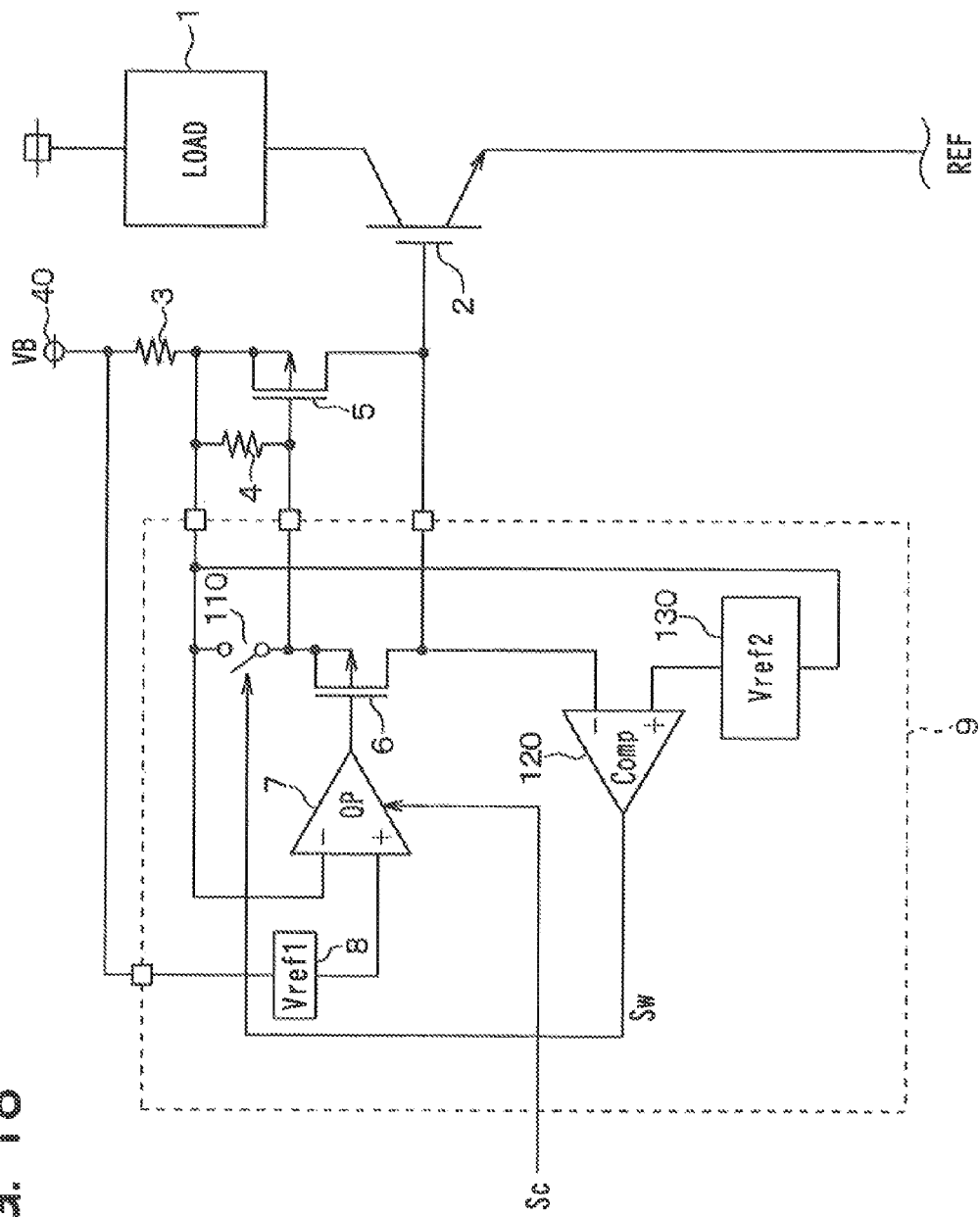
FIG. 18 is a circuit diagram of a load driving apparatus according to a thirteenth embodiment of the present invention.

As shown in FIG. 18, according to the thirteenth embodiment, the load driving apparatus includes the comparator 120 and the reference voltage source 130 that construct the switching signal generator instead of the timer 11. A drain voltage of the P-channel MOSFET 5 is inputted to the inverting input terminal (−) of the comparator 120, and a source voltage of the P-channel MOSFET 5 is inputted through the reference voltage source 130 to the non-inverting input terminal (+) of the comparator 120. The comparator 120 performs a comparison between the reference voltage Vre2 and the drain-source voltage of the first P-channel MOSFET 5 and outputs the switching signal Sw to the switch 110 based on a result of the comparison. Specifically, when the drain-source voltage of the first P-channel MOSFET 5 decreases below the reference voltage Vref2, the comparator 120 outputs the switching signal Sw to the switch 110. It is noted that when the drain-source voltage of the first P-channel MOSFET 5 decreases below the reference voltage Vref2, the first P-channel MOSFET 5 is turned OFF.

As described above, according to the thirteenth embodiment, the load driving apparatus includes the switching signal generator for outputting the switching signal Sw to the switch 110 based on the voltage between the drain (i.e., first terminal) and the source (i.e., second terminal) of the first P-channel MOSFET (i.e., first transistor). Specifically, the switching signal Sw is outputted to the switch 110, when the drain-source voltage of the first P-channel MOSFET 5 decreases below the reference voltage Vref2, that can turn OFF the first P-channel MOSFET 5. The reference voltage Vref2 is determined in such a manner that when the drain-source voltage of the first P-channel MOSFET 5 decreases below the reference voltage Vref2, the first P-channel MOSFET 5 is turned OFF. Even in such an approach, the same advantages as the preceding embodiments can be obtained.

In FIG. 18, the switching signal generator is added to the load driving apparatus of the eighth embodiment. Likewise, the switching signal generator can be added to the load driving apparatus of any one of the ninth to eleventh embodiments.

Fourteenth Embodiment

A load driving apparatus according to a fourteenth embodiment of the present invention is described below with reference to FIG. 19. A difference of the fourteenth embodiment from the twelfth and thirteenth embodiments is as follows. According to the fourteenth embodiment, the switching signal generator outputs the switching signal Sw to the switch 110 based on the voltage between the source (i.e., second terminal) and the gate (i.e., control terminal) of the first P-channel MOSFET 5 (i.e., first transistor).

Figure 19:
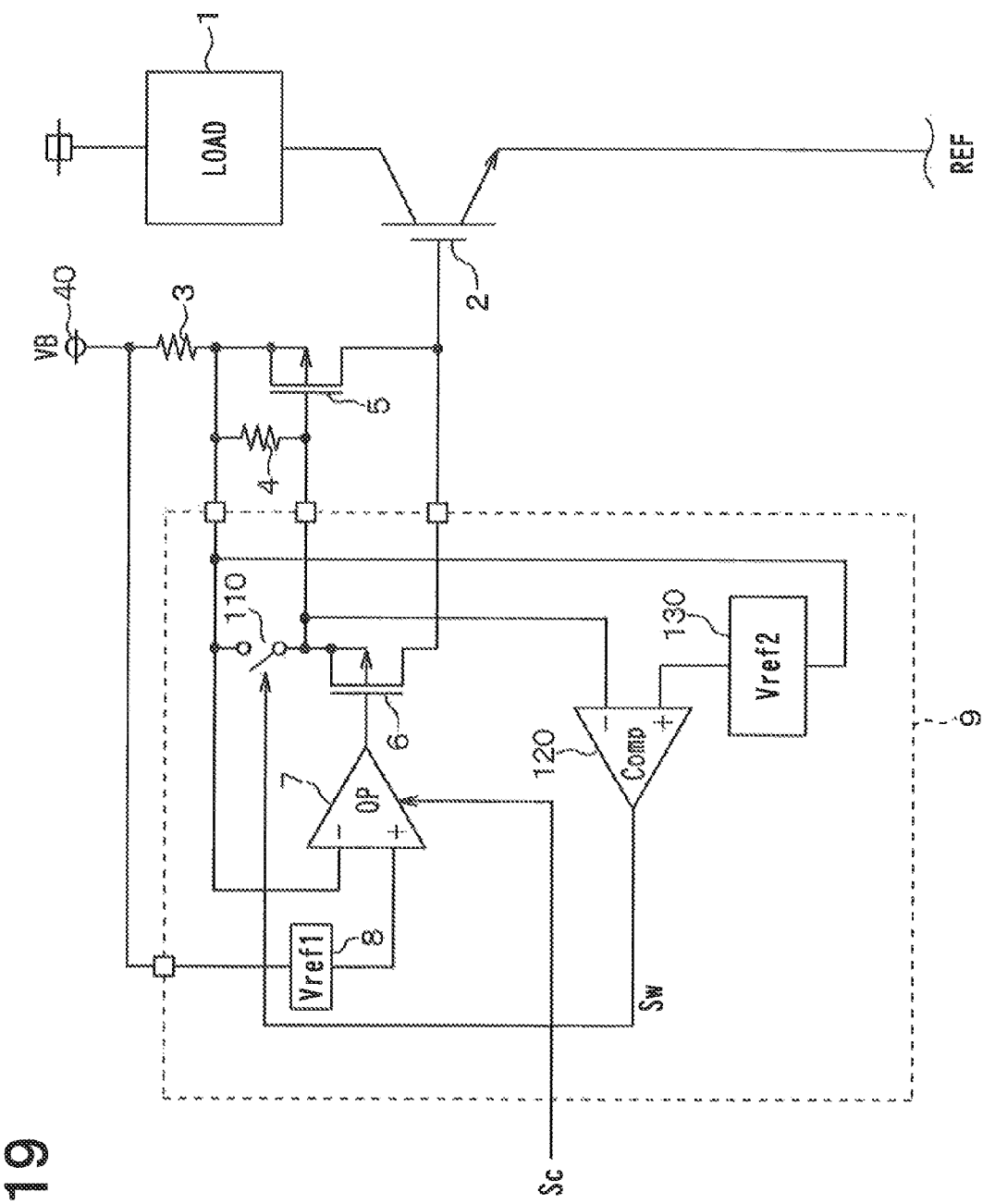
FIG. 19 is a circuit diagram of a load driving apparatus according to a fourteenth embodiment of the present invention.

As shown in FIG. 19, the load driving apparatus includes the comparator 120 and the reference voltage source 130 that construct the switching signal generator instead of the timer 11. A gate voltage of the P-channel MOSFET 5 is inputted to the inverting input terminal (−) of the comparator 120, and a source voltage of the P-channel MOSFET 5 is inputted through the reference voltage source 130 to the non-inverting input terminal of the comparator 120. The comparator 120 performs a comparison between the reference voltage Vref2 and the gate-source voltage of the first P-channel MOSFET 5 and outputs the switching signal Sw to the switch 110 based on a result of the comparison. Specifically, when the gate-source voltage of the first P-channel MOSFET 5 exceeds the reference voltage Vref2, the comparator 120 outputs the switching signal Sw to the switch 110. It is noted that when the gate-source voltage of the first P-channel MOSFET 5 exceeds the reference voltage Vref2, the first P-channel MOSFET 5 is turned OFF.

As described above, according to the fourteenth embodiment, the load driving apparatus includes the switching signal generator for outputting the switching signal Sw to the switch 110 based on the voltage between the source (i.e., second terminal) and the gate (i.e., control terminal) of the first P-channel MOSFET 5 (i.e., first transistor). Specifically, the switching signal Sw is outputted to the switch 110, when the gate-source voltage of the first P-channel MOSFET 5 exceeds the reference voltage Vref2. The reference voltage Vref2 is determined in such a manner that when the gate-source voltage of the first P-channel MOSFET 5 exceeds the reference voltage Vref2, the first P-channel MOSFET 5 is turned OFF. Even in such an approach, the same advantages as the preceding embodiments can be obtained.

In FIG. 19, the switching signal generator is added to the load driving apparatus of the eighth embodiment. Likewise, the switching signal generator can be added to the load driving apparatus of any one of the ninth to eleventh embodiments.

Fifteenth Embodiment

A load driving apparatus according to a fifteenth embodiment of the present invention is described below with reference to FIG. 20. A difference of the fifteenth embodiment from the preceding embodiments is as follows.

Figure 20:
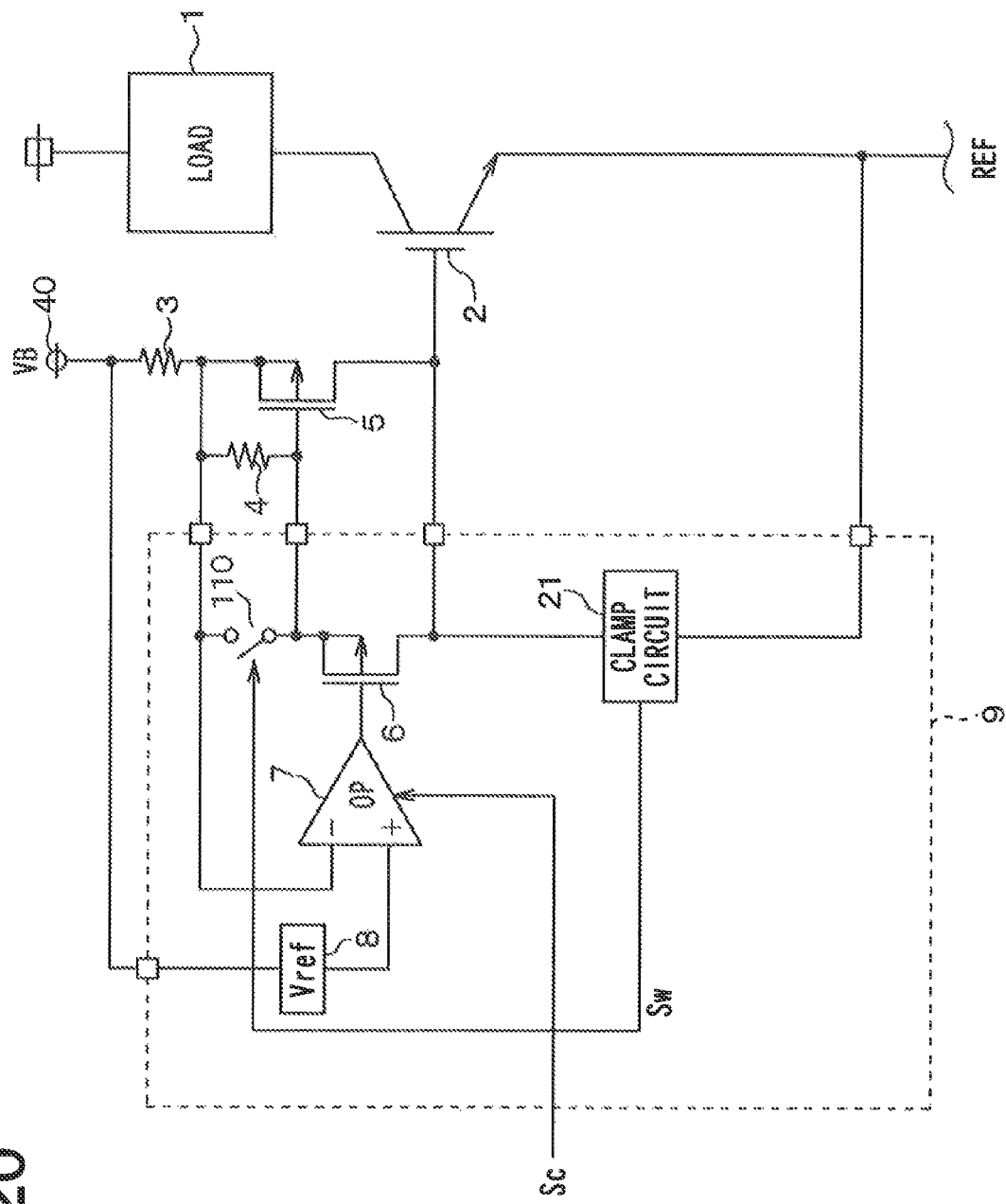
FIG. 20 is a circuit diagram of a load driving apparatus according to a fifteenth embodiment of the present invention.

As shown in FIG. 20, according to the fifteenth embodiment, the load driving apparatus includes a clamp circuit 21 instead of the timer 11. The clamp circuit 21 is connected to the gate (i.e., control terminal) of the switching device 2 and performs a clamp action for clamping the gate voltage of the switching device 2 to a predetermined clamp voltage. When the clamp action is finished, the clamp circuit 21 outputs the switching signal Sw to the switch 110. The clamp circuit 21 performs the clamp action in a transient state, which occurs when the switching device 2 is driven, to prevent an excessive current flowing through the switching device 2. Due to the clamp action, the switching device 2 is half ON so that the excessive current cannot flow through the switching device 2. For example, the clamp action can be finished after a predetermined elapsed time from when the switching device 2 starts to be turned ON. The clamp circuit 21 outputs the switching signal Sw to the switch 110 at the same time as the clamp action is finished.

As described above, according to the fifteenth embodiment, the load driving apparatus includes the clamp circuit 21 for performing the clamp action in the transient state to clamp the voltage of the gate (i.e., control terminal) of the switching device 2 to a predetermined clamp voltage. The clamp circuit 21 outputs the switching signal Sw to the switch 110 at the same time as the clamp action is finished. In such an approach, the same advantages as the preceding embodiments can be obtained.

In FIG. 20, the clamp circuit 21 is added to the load driving apparatus of the eighth embodiment. Likewise, the clamp circuit 21 can be added to the load driving apparatus of any one of the ninth to eleventh embodiments.

Sixteenth Embodiment

A load driving apparatus according to a sixteenth embodiment of the present invention is described with reference to FIGS. 21 and 22. A difference of the sixteenth embodiment from the eighth embodiment is as follows.

The load driving apparatus of FIG. 11 is suitable for driving the switching device 2, when a gate capacitance of the switching device 2 is large. In FIG. 11, the first P-channel MOSFET 5, which is used to drive the switching device 2, and the second P-channel MOSFET 6, which is used as a pre-driver, are connected together in a Darlington configuration. In this configuration, there is a concern that the first P-channel MOSFET 5 is turned OFF when the gate voltage of the switching device 2 becomes equal to or greater than the value (VB−VR1−Vt) obtained by subtracting the voltage drop VR1 across the first resistor 3 and the threshold voltage Vt of the first P-channel MOSFET 5 from the power supply voltage VB of the power source 40. Therefore, as compared to when only the second P-channel MOSFET 6 is used without using the first P-channel MOSFET 5, an operating voltage input range of the switching device 2 becomes small by the threshold voltage Vt of the first P-channel MOSFET 5. Further, in this case, the switching device 2 is pulled up based on the first resistor 3, the second resistor 4, and the ON-resistance of the second P-channel MOSFET 6. Since a resistance R2 (e.g., 100Ω) of the second resistor 4 is sufficiently greater than a resistance R1 of the first resistor 3, the driving speed of the switching device 2 is much reduced so that loss in the switching device 2 can be increased.

Figure 21:
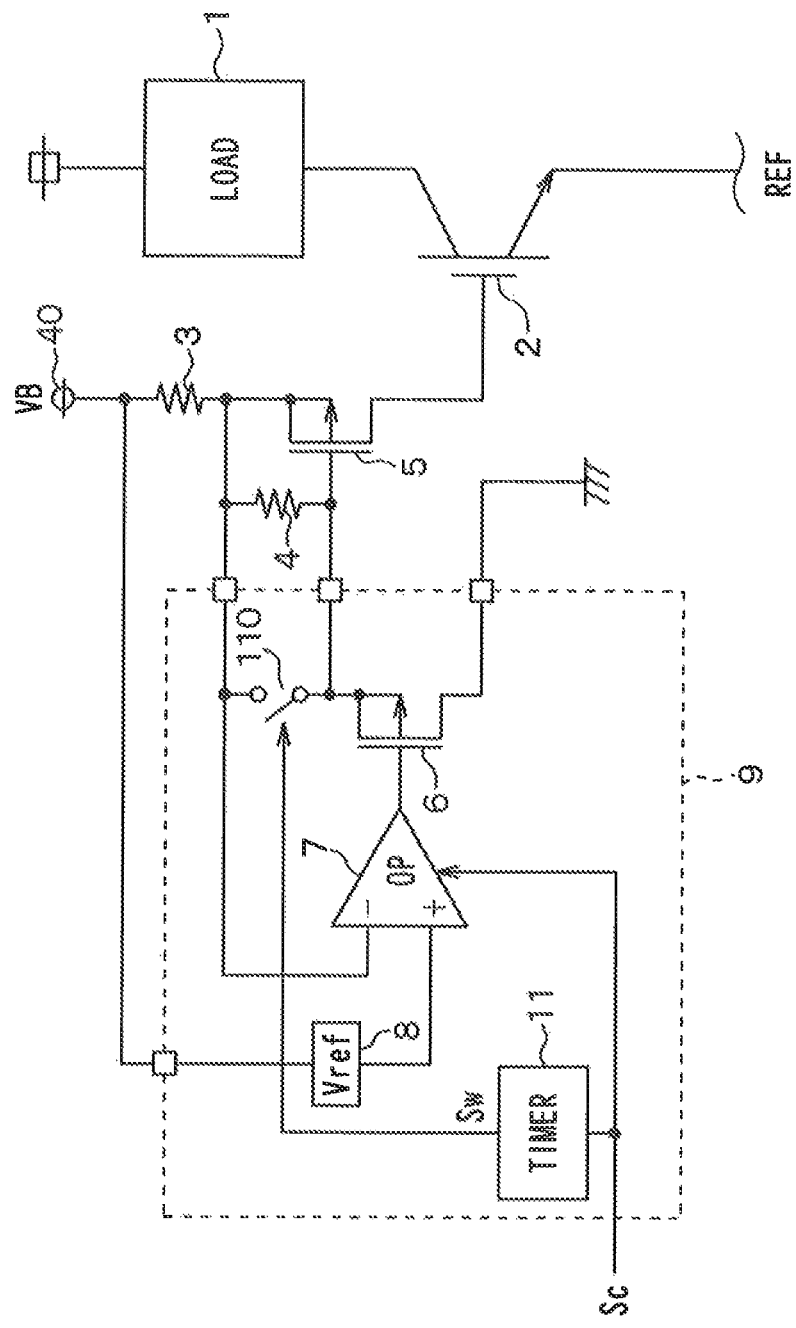
FIG. 21 is a circuit diagram of a load driving apparatus studied by the present inventors.

To avoid such disadvantages, the present inventors have developed a load driving apparatus shown in FIG. 21. In FIG. 21, the drain of the second P-channel MOSFET 6 is connected to the ground potential so that the gate of the first P-channel MOSFET 5 can be connected to the ground potential by turning ON the second P-channel MOSFET 6. In such an approach, the first P-channel MOSFET 5 is kept ON during the mirror period so that the constant current can be stably supplied to the gate of the switching device 2.

However, the present inventors have found out that the load driving apparatus of FIG. 21 consumes a large amount of current. Specifically, in FIG. 21, since the drain of the second P-channel MOSFET 6 is connected to the ground potential, the current always flows through the second P-channel MOSFET 6. Further, the first P-channel MOSFET 5 may be configured as a discrete component for heat protection and current capability improvement. Furthermore, the constant current supplied to the gate of the switching device 2 needs to be increased according to the gate capacitance of the switching device 2 to drive the switching device 2 at fast speeds. In FIG. 21, since the drain of the second P-channel MOSFET 6 is connected to the ground potential, the current flowing through the second P-channel MOSFET 6 is discharged to the ground. Therefore, an increase in the driving speed of the switching device 2 results in a large increase in consumption current.

Figure 22:
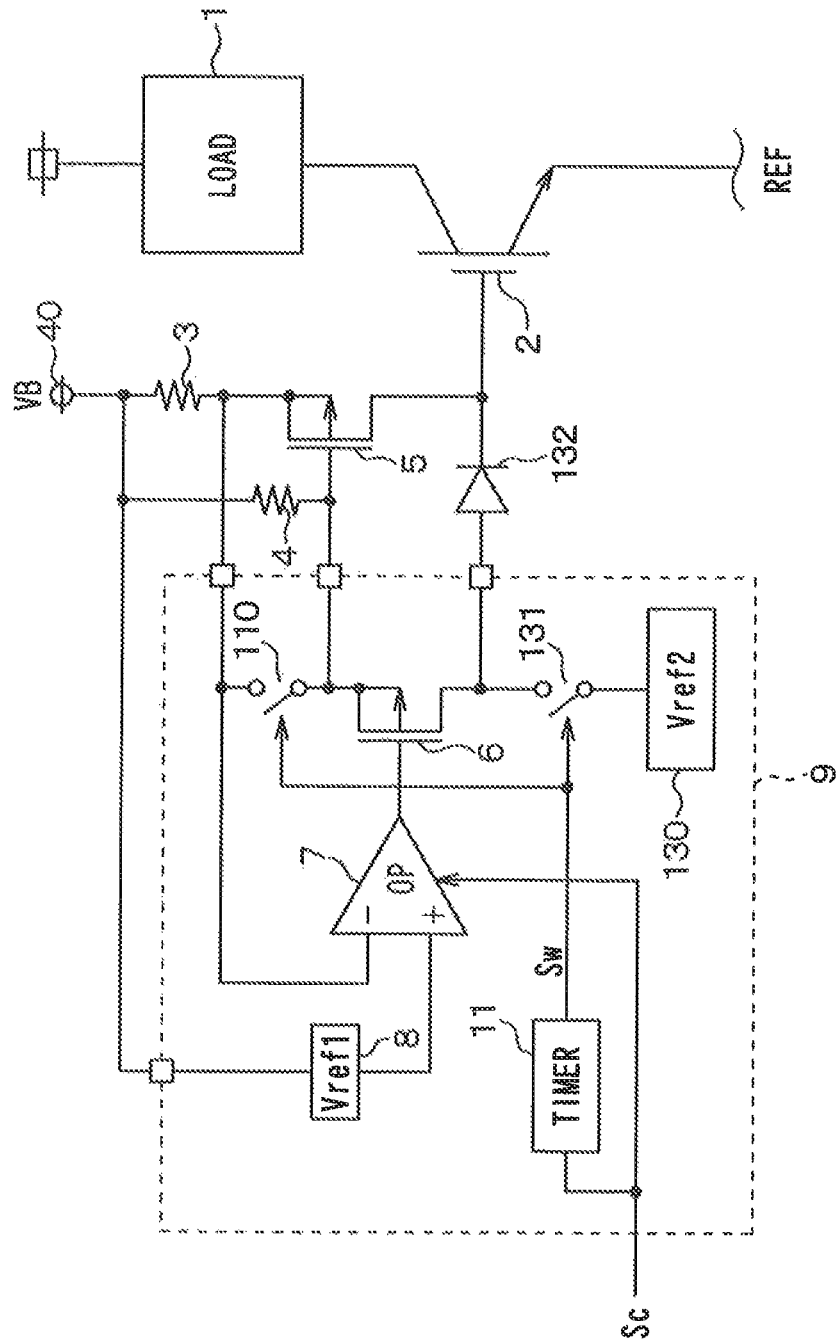
FIG. 22 is a circuit diagram of a load driving apparatus according to a sixteenth embodiment of the present invention.

Based on the above studies, the present inventors have developed a load driving apparatus of FIG. 22 for reducing consumption current without a reduction in the operating voltage input range.

As shown in FIG. 22, according to the sixteenth embodiment, the drain of the second P-channel MOSFET 6 is connected through a switch 131 to the reference voltage source 130. The reference voltage source 130 generates the reference voltage Vref2 and is separate from the reference voltage source 8 that generates the reference voltage Vref1. A node between the drain of the second P-channel MOSFET 6 and the switch 131 is connected to the gate of the switching device 2 and the drain of the first P-channel MOSFET 5.

In the load driving apparatus of FIG. 22, when the switching device 2 is driven, the switch 131 is turned ON so that the reference voltage Vref2 of the reference voltage source 130 can be applied to the gate of the first P-channel MOSFET 5. In such an approach, the first P-channel MOSFET 5 is surely turned ON so that the constant current can be stably supplied to the gate of the switching device 2. Then, when the gate voltage of the switching device 2 exceeds the mirror voltage Vmirror, the switch 131 is turned OFF so that the consumption current can be reduced. In this way, the consumption current can be reduced without a reduction in the operating voltage input range.

Further, as shown in FIG. 22, according to the sixteenth embodiment, a diode 132 is placed in a current path connecting the node between the drain of the second P-channel MOSFET 6 and the switch 131 to a node between the gate of the switching device 2 and the drain of the first P-channel MOSFET 5. The diode 132 prevents a reverse flow of current from the gate of the switching device 2 toward the reference voltage source 130.

The switching signal for switching (i.e., turning ON) the switches 10 and 31 can be outputted based on an elapsed time from when the control signal Sc is inputted to the timer 11 or based on the gate voltage of the switching device 2. According to the sixteenth embodiment, like the eighth embodiment, the timer 11 outputs the switching signal Sw to the switches 10 and 31 after a predetermined elapsed time from when the control signal Sc is inputted to the timer 11. The time elapsed from when the gate voltage of the switching device 2 starts to increase due the turn-ON of the switching device 2 to when the gate voltage of the switching device 2 exceeds the mirror voltage Vmirror can be estimated from characteristics of the switching device 2. The estimated time is set as the predetermined elapsed time from when the control signal Sc is inputted to the timer 11 to when the timer 11 outputs the switching signal Sw to the switches 10 and 31. Alternatively, like the twelfth embodiment, the switching signal can be outputted based on the gate voltage of the switching device 2. In this case, the switching signal Sw is outputted when the gate voltage of the switching device 2 exceeds the mirror voltage Vmirror.

As can be seen from FIG. 22, according to the sixteenth embodiment, the second resistor 4 is connected between the high side (i.e., power supply voltage VB side) of the first register 3 and the gate of the first P-channel MOSFET 5. In such an approach, all the current flowing through the first resistor 3 is supplied to the first P-channel MOSFET 5 so that the constant current can be stably supplied to the first P-channel MOSFET 5. Alternatively, like the eighth embodiment, the second resistor 4 can be connected between the low potential side of the first register 3 and the gate of the first P-channel MOSFET 5.

The reference voltage Vref2 of the reference voltage source 130 is set to a value that can turn ON the switching device 2. Specifically, the reference voltage Vref2 is set less than the value (VB−VR1−Vt) obtained by subtracting the voltage drop VR1 across the first resistor 3 and the threshold voltage Vt of the first P-channel MOSFET 5 from the power supply voltage VB.

Figure 23:
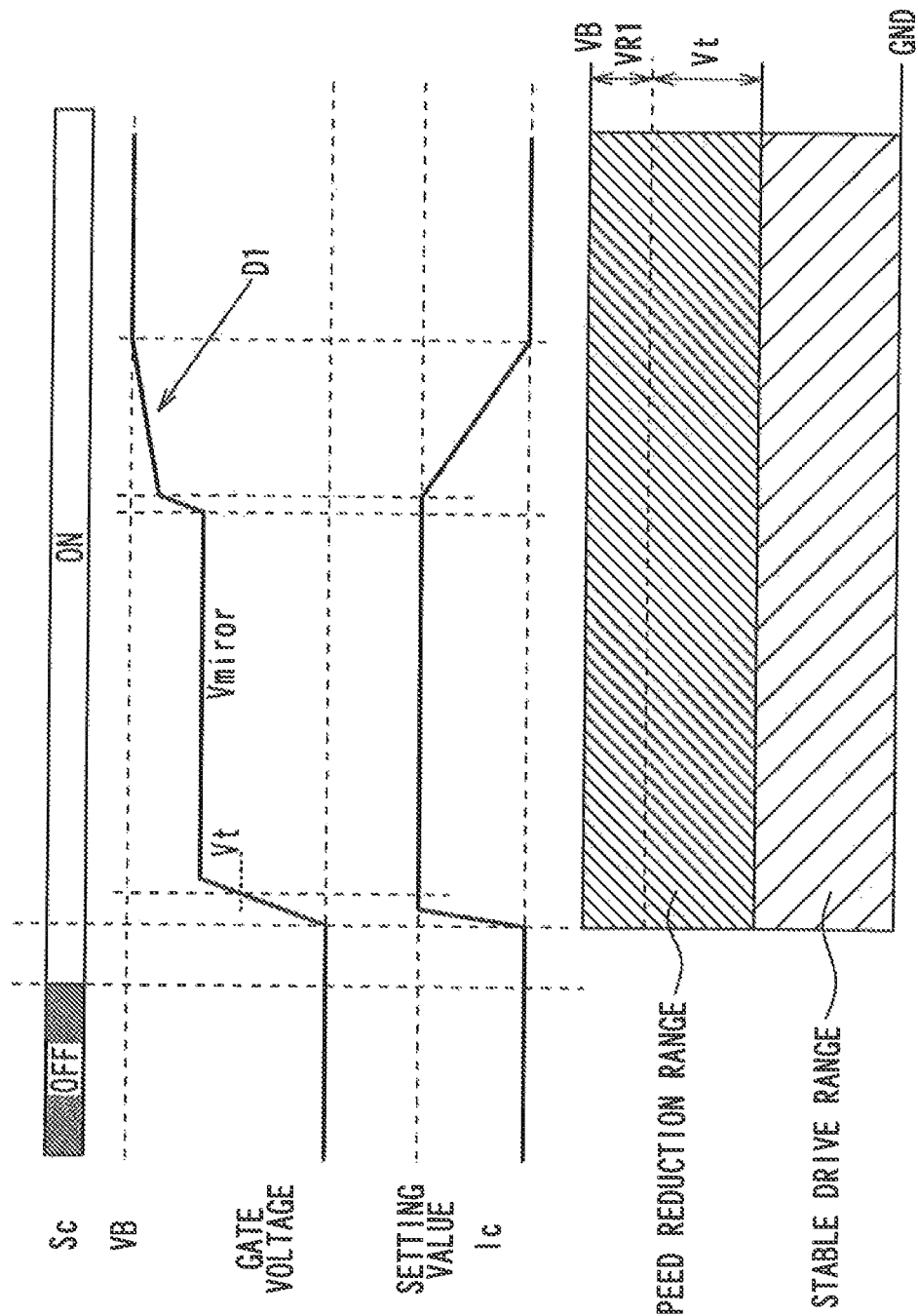
FIG. 23 is a timing diagram of the load driving apparatus of FIG. 11.
Figure 24:
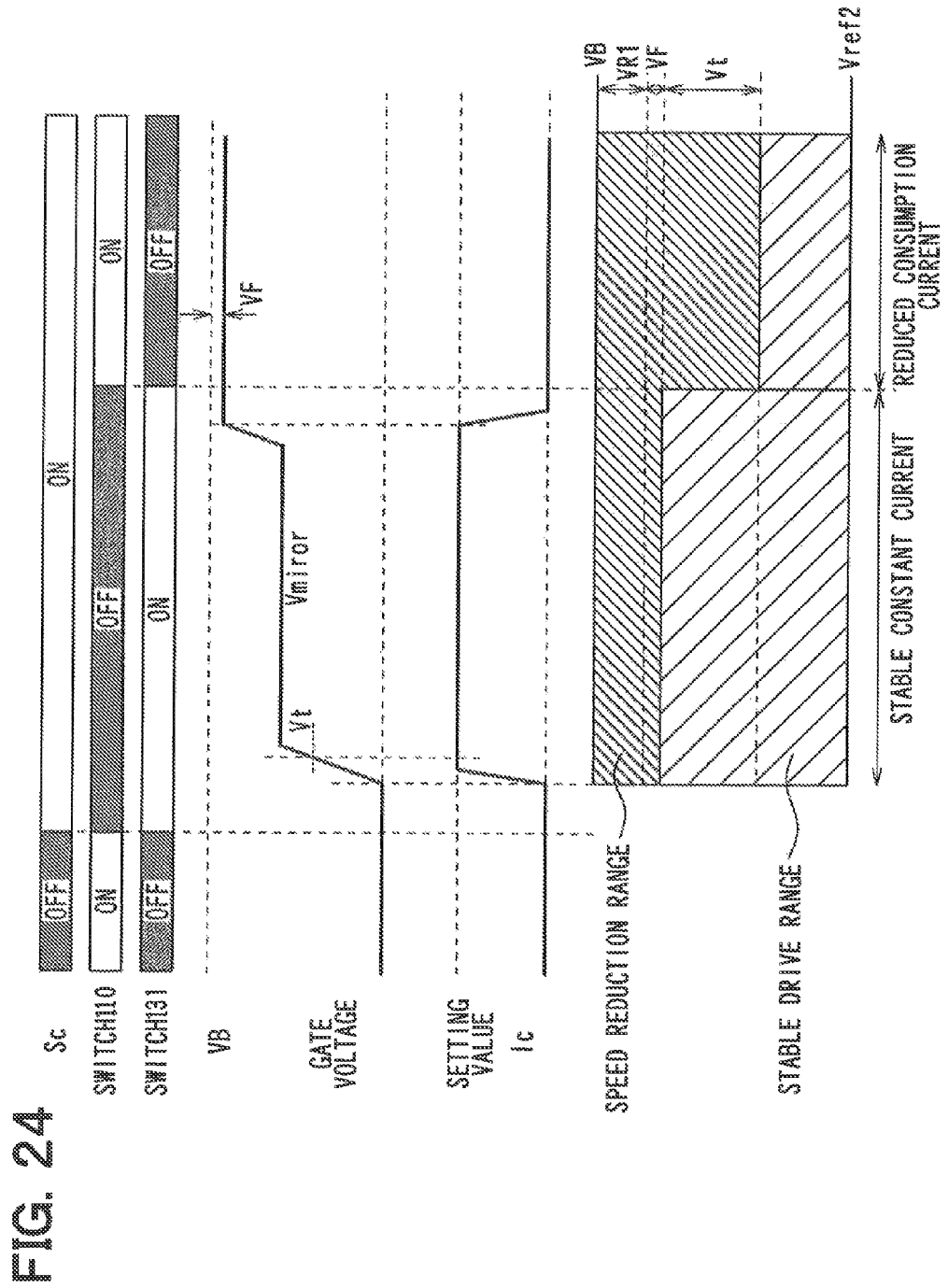
FIG. 24 is a timing diagram of the load driving apparatus of FIG. 22 in which a second switch is switched based on an elapsed time from when a control signal is inputted to a timer.
Figure 25:
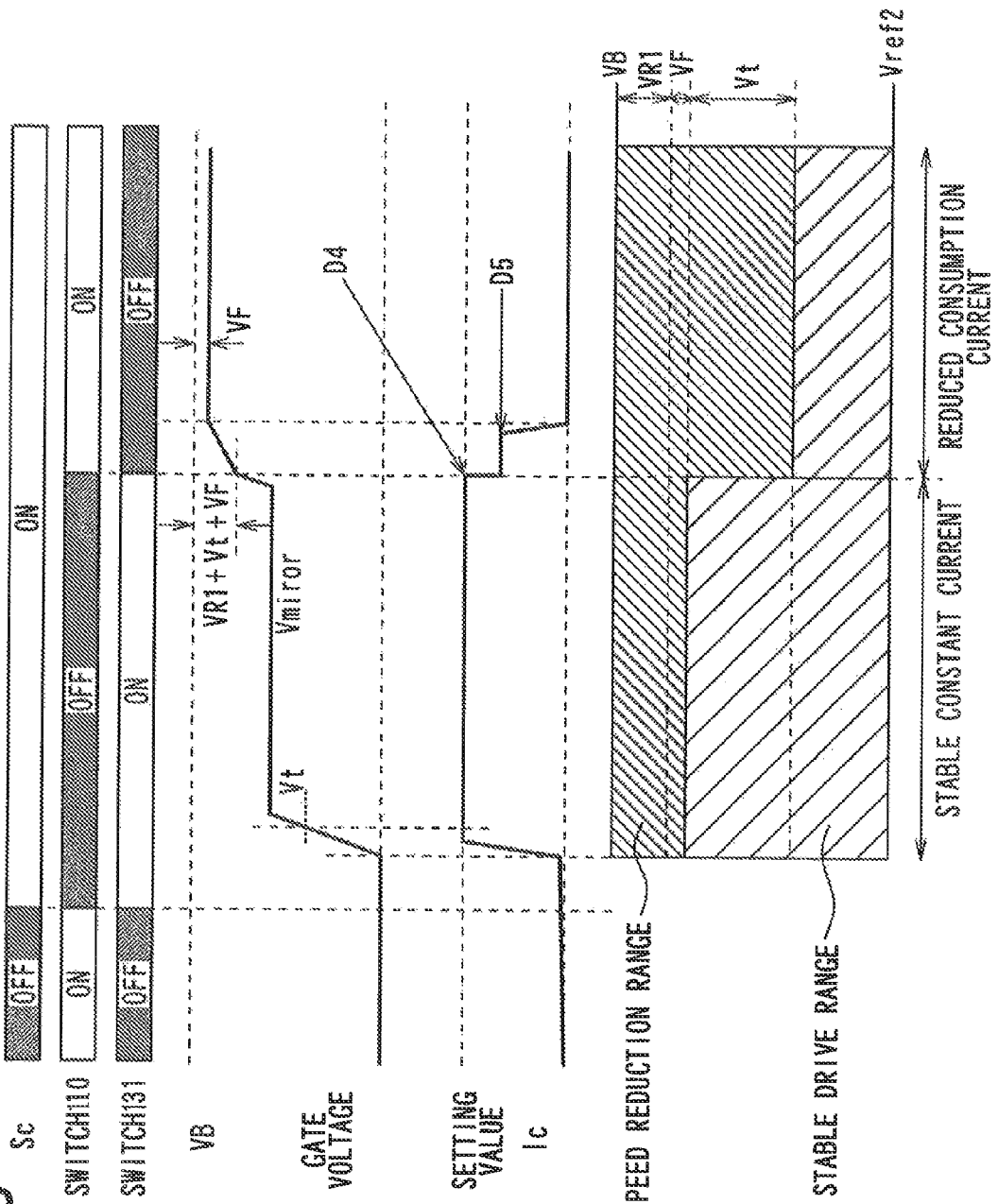
FIG. 25 is a timing diagram of the load driving apparatus of FIG. 22 in which the second switch is switched based on a gate voltage of a switching device.

FIG. 23 is a timing diagram of the load driving apparatus of FIG. 11. FIG. 24 is a timing diagram of the load driving apparatus of FIG. 22 in which the switch 131 is switched (i.e., turned ON) based on an elapsed time from when the control signal Sc is inputted to the timer 11. FIG. 25 is a timing diagram of the load driving apparatus of FIG. 22 in which the switch 131 is switched (i.e., turned ON) based on the gate voltage of the switching device 2. It is noted that FIG. 23 corresponds to FIG. 12 or FIG. 13.

As shown in FIG. 23, in the load driving apparatus of FIG. 11, when the gate voltage of the switching device 2 becomes equal to or greater the value (VB−VR1−Vt) obtained by subtracting the voltage drop VR1 across the first resistor 3 and the threshold voltage Vt of the first P-channel MOSFET 5 from the power supply voltage VB, the driving speed of the switching device 2 is much reduced. Further, since the load driving apparatus of FIG. 11 does not have the switch 131 and the reference voltage source 130, a stable drive voltage range where the switching device 2 can be stably driven is kept below the value (VB−VR1−Vt). In a driving speed reduction voltage range above the value (VB−VR1−Vt), the driving speed of the switching device 2 is much reduced.

In contrast, as shown in FIGS. 24, 25, in the load driving apparatus of FIG. 22, the switch 131 is turned ON at the same time when the switch 110 is turned OFF after a predetermined elapsed time from when the control signal Sc is inputted. Thus, the gate of the first P-channel MOSFET 5 is connected to the reference voltage source 130 so that the current can be drawn from the gate of the first P-channel MOSFET 5. Therefore, during turn-ON of the switch 131, the second P-channel MOSFET 6 is driven so that the constant current can suitably be supplied to the switching device 2. That is, during turn-ON of the switch 131, the stable drive voltage range where the switching device 2 can be stably driven becomes below a value (VB−VR1). Thus, the operating voltage input range is increased.

Then, when the gate voltage of the switching device 2 exceeds the mirror voltage Vmirror, the switch 131 is turned OFF. Thus, the current flowing through the second P-channel MOSFET 6 is supplied to the gate of the switching device 2 so that consumption current can be reduced.

As shown in FIG. 24, when the switch 131 is switched based on an elapsed time from when the control signal Sc is inputted, the elapsed time is determined based on the mirror period where the gate voltage of the switching device 2 is kept at the mirror voltage Vmirror. This is because the mirror period is almost constant. In contrast, as shown in FIG. 25, when the switch 131 is switched based on the gate voltage of the switching device 2, the switch 131 is switched when the gate voltage of the switching device 2 exceeds the mirror voltage Vmirror. For example, the switch 131 can be switched when the gate voltage of the switching device 2 reaches a value (VB−(VR1+Vt+VF)) obtained by subtracting the voltage drop VR1 across the first resistor 3, the threshold voltage Vt of the first P-channel MOSFET 5, and a forward voltage VF of the diode 132 from the power supply voltage VB. In this case, if the constant current setting value Is exceeds the current capability of the second P-channel MOSFET 6, the constant current Ic decreases to the current capability of the second P-channel MOSFET 6. Then, when the drain-source voltage of the second P-channel MOSFET 6 becomes zero, the switching device 2 is pulled up. Therefore, as compared to FIG. 24, loss caused until the switching device 2 is full ON is increased.

As described above, according to the sixteenth embodiment of the present invention, the drain of the second P-channel MOSFET is connected through the switch 131 to the reference voltage source 130. In such an approach, the current consumption is reduced without a reduction in the operating voltage input range. Further, the node between the drain of the second P-channel MOSFET 6 and the switch 131 is connected to the gate of the switching device 2 and the drain of the first P-channel MOSFET 5. Furthermore, the diode 132 is placed in the current path connecting the node between the drain of the second P-channel MOSFET 6 and the switch 131 to the node between the gate of the switching device 2 and the drain of the first P-channel MOSFET 5. Thus, the diode 132 prevents a reverse flow of current from the gate of the switching device 2 toward the reference voltage source 130.

Seventeenth Embodiment

A load driving apparatus according to a seventeenth embodiment of the present invention is described below with reference to FIG. 26. A difference of the seventeenth embodiment from the sixteenth embodiment is as follows.

Figure 26:
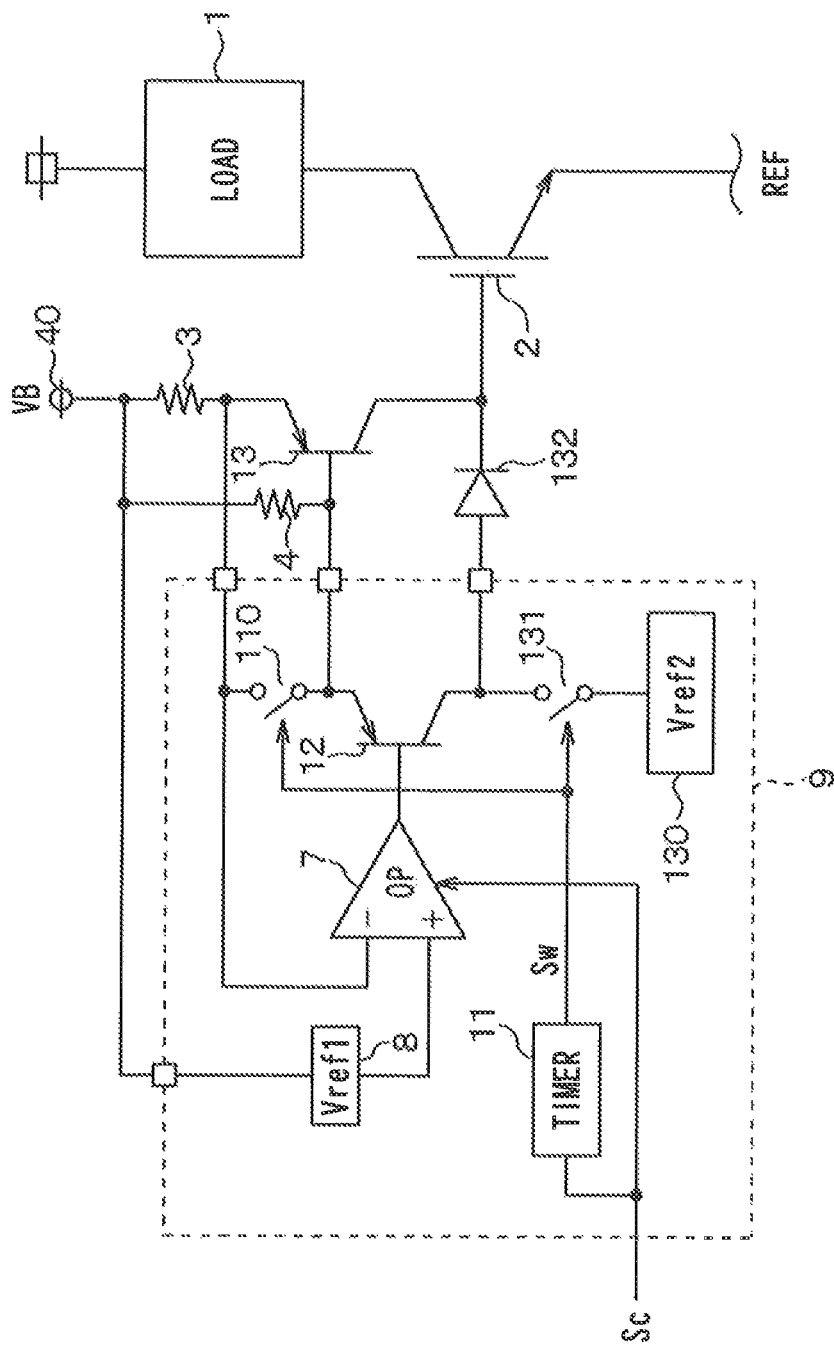
FIG. 26 is a circuit diagram of a load driving apparatus according to a seventeenth embodiment of the present invention.

As shown in FIG. 26, according to the seventeenth embodiment, the Darlington circuit is constructed with the first PNP transistor 12 and the second PNP transistor 13 instead of the first P-channel MOSFET 5 and the second P-channel MOSFET 6. The switch 110 is connected between the base and the emitter of the first PNP transistor 12. That is, the seventeenth embodiment is a modification of the sixteenth embodiment based on the ninth embodiment.

As described above, according to the seventeenth embodiment, the Darlington circuit of the ON-side driver circuit is constructed with PNP transistors instead of P-channel MOSFETs. Even in such an approach, the load driving apparatus can operate in the same manner as the sixteenth embodiment so that the same advantages as the sixteenth embodiment can be obtained.

Eighteenth Embodiment

Figure 27:
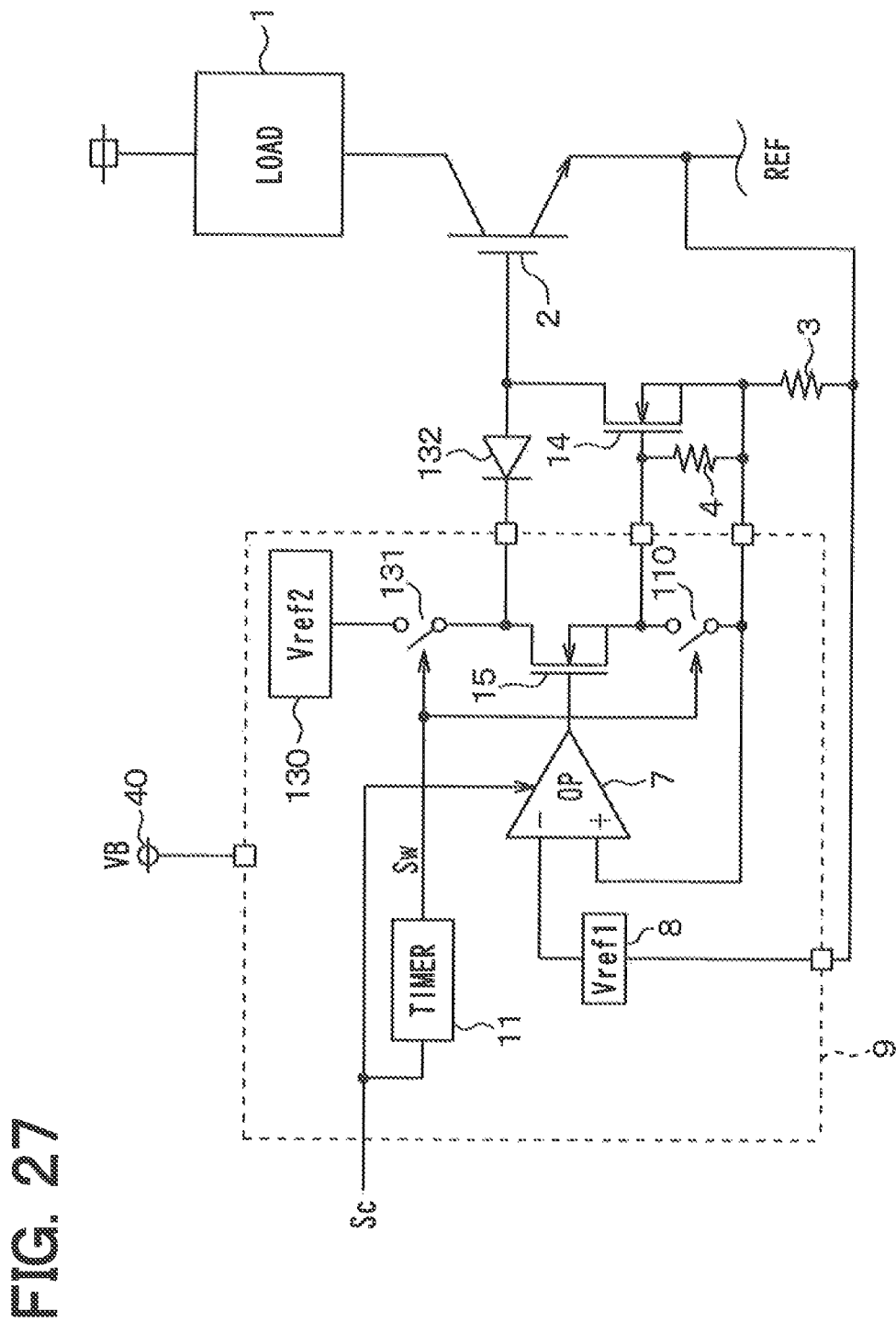
FIG. 27 is a circuit diagram of a load driving apparatus according to an eighteenth embodiment of the present invention.

A load driving apparatus according to an eighteenth embodiment of the present invention is described below with reference to FIG. 27. A difference of the eighteenth embodiment from the sixteenth embodiment is that the ON-side driver circuit is replaced with an OFF-side driver circuit for turning OFF the switching device 2.

Figure 15:
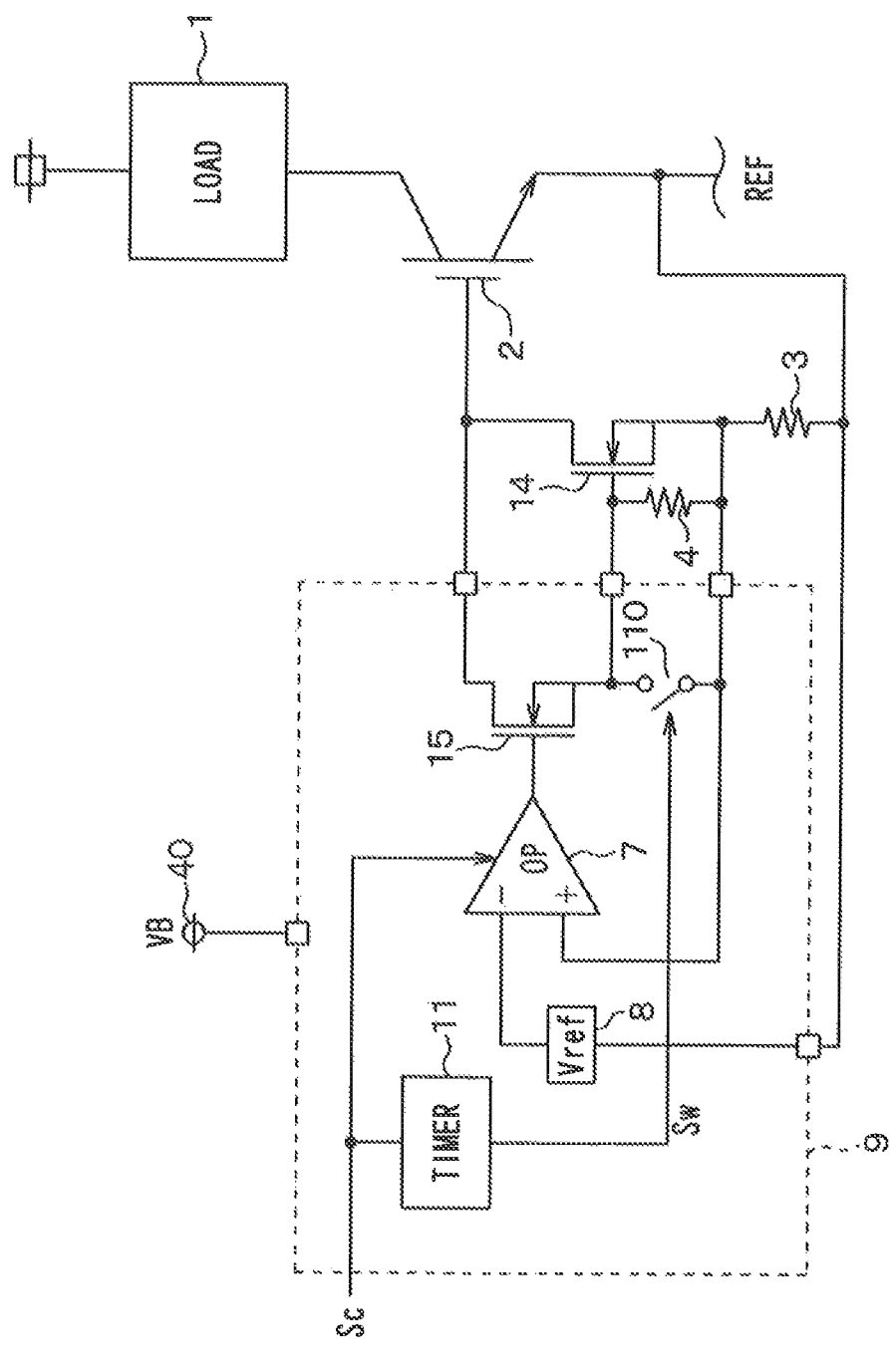
FIG. 15 is a circuit diagram of a load driving apparatus according to a tenth embodiment of the present invention.

The OFF-side driver circuit of the eighteenth embodiment is configured in almost the same manner as the OFF-side driver circuit of the tenth embodiment shown in FIG. 15 and further includes the reference voltage source 130, the switch 131, and the diode 132. That is, the eighteenth embodiment is a modification of the sixteenth embodiment based on the tenth embodiment. Specifically, the drain of the second N-channel MOSFET 15 is connected through the switch 131 to the reference voltage source 130. The node between the drain of the second N-channel MOSFET 15 and the switch 131 is connected to the gate of the switching device 2 and the drain of the first N-channel MOSFET 14. The diode 132 is placed in a current path connecting the node between the drain of the second N-channel MOSFET 15 and the switch 131 to a node between the gate of the switching device 2 and the drain of the first N-channel MOSFET 14.

As described above, according to the eighteenth embodiment, the load driving apparatus includes the OFF-side driver circuit for tuning OFF the switching device. The OFF-side driver circuit of the eighteenth embodiment operates in an opposite manner as the ON-side driver circuit of the sixteenth embodiment shown in FIGS. 24 and 25. Even in such an approach, the same advantages as the sixteenth embodiment can be obtained.

Nineteenth Embodiment

A load driving apparatus according to a nineteenth embodiment of the present invention is described below with reference to FIG. 28. A difference of the nineteenth embodiment from the eighteenth embodiment is as follows.

Figure 28:
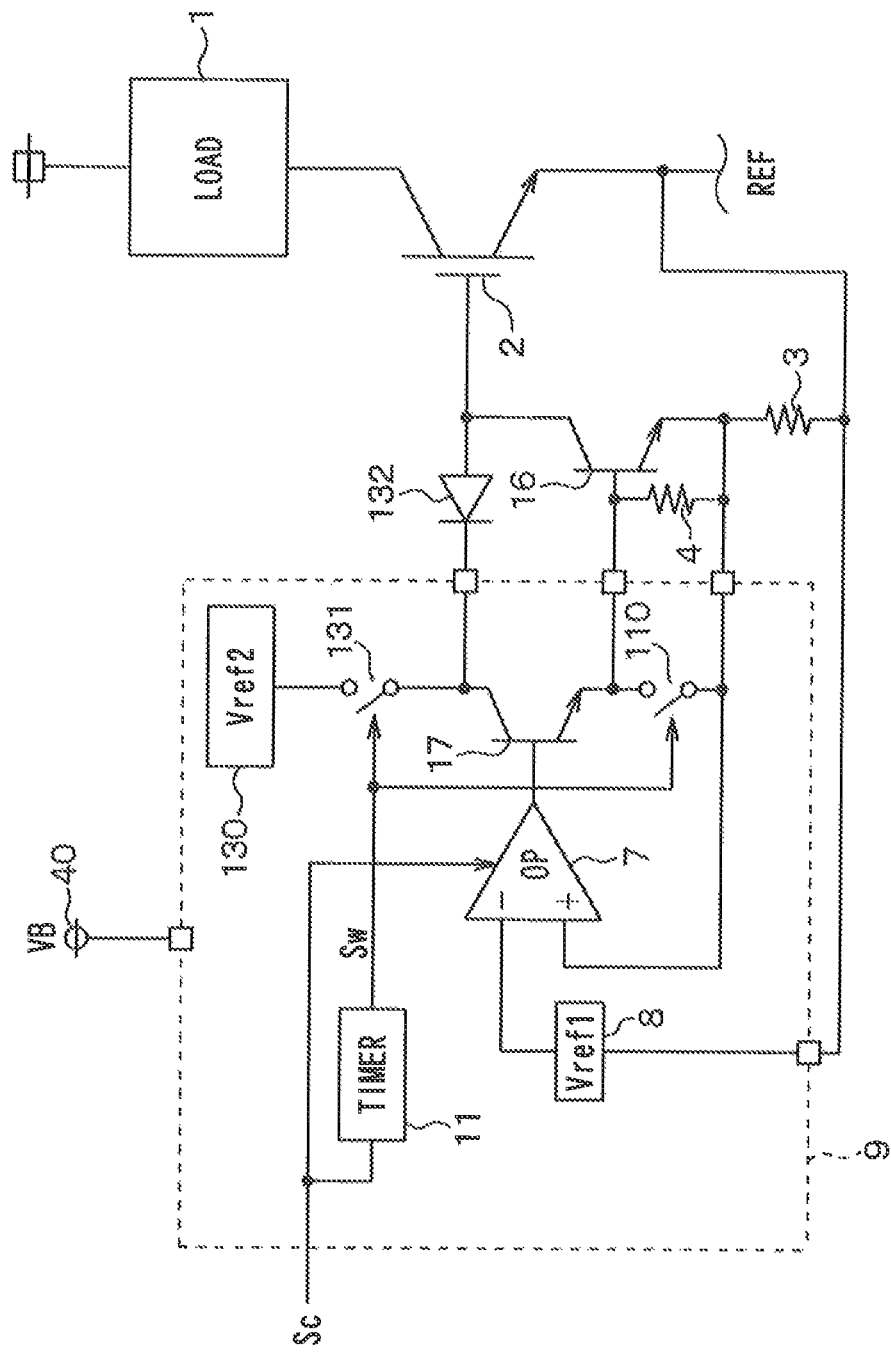
FIG. 28 is a circuit diagram of a load driving apparatus according to a nineteenth embodiment of the present invention.

As shown in FIG. 28, according to the nineteenth embodiment, the Darlington circuit is constructed with the first NPN transistor 16 and the second NPN transistor 17 instead of the first N-channel MOSFET 14 and the second N-channel MOSFET 15. The switch 110 is connected between the base and the emitter of the first NPN transistor 16. That is, the nineteenth embodiment is a modification of the eighteenth embodiment based on the twelfth embodiment.

As described above, according to the nineteenth embodiment, the Darlington circuit of the OFF-side driver circuit is constructed with NPN transistors instead of N-channel MOSFETs. Even in such an approach, the load driving apparatus can operate in the same manner as the eighteenth embodiment so that the same advantages as the eighteenth embodiment can be obtained.

Modifications

The above embodiments can be modified in various ways. For example, the elements such as the switching element 35, 50, and the first resistor 33 of the sixth and seventh embodiments can be replaced with corresponding elements of the third to fifth embodiments. It is noted that when the first resistor 33 shown in FIGS. 8-10 is replaced with the constant current source 36, the constant current source 36 is connected to the operational amplifier 34 and the first switching element 35 so that the current can flow to the reference potential.

When the second switching element 50 is added to the load driving apparatus, the elements can be used in various combinations.

For example, the first switching element 35 can be a power MOSFET, and the second switching element can be a bipolar transistor. In this case, the first resistor 33 can be replaced with the constant current source 36. Further, as shown in FIGS. 4 and 10, the first switching element 35 can be connected to the second switching element 50 so that the current flowing through the first switching element 35 can be joined to the current flowing through the second switching element 50.

For another example, the first switching element 35 can be a bipolar transistor, and the second switching element can be a power MOSFET. In this case, the first resistor 33 can be replaced with the constant current source 36. Further, the first switching element 35 can be connected to the second switching element 50 so that the current flowing through the first switching element 35 can be joined to the current flowing through the second switching element 50.

When the first switching element 35 and the second switching element 50 are MOSFETs, the first switching element 35 and the second switching element 50 can be driven at fast speeds. When the first switching element 35 and the second switching element 50 are bipolar transistors, the costs of the first switching element 35 and the second switching element 50 can be reduced.

The load 10 can be driven by a combination of the ON-drive load driving apparatus of FIGS. 1-7 and the OFF-drive load driving apparatus of FIGS. 8-10. Alternatively, the load 10 can be driven by a combination of one of the ON-drive load driving apparatus and the OFF-drive load and another switching element. For example, the load 10 can be driven by a combination of the ON-drive load driving apparatus and a MOSFET for turning OFF the load 10. For another example, the load 10 can be driven by a combination of the OFF-drive load driving apparatus and a MOSFET for turning ON the load 10.

The load driving apparatus of the eighth, ninth, sixteenth, and seventeenth embodiments has the ON-side driver circuit, and the load driving apparatus of the tenth, eleventh, eighteenth, and nineteenth embodiments has the OFF-side driver circuit. Alternatively, the load driving apparatus can have both the ON-side driver circuit and the OFF-side driver circuit.

In the eighth to nineteenth embodiments, the second resistor 4 is used as the pull-up member. Alternatively, a constant current source can be used as the pull-up member.

In the eighth to nineteenth embodiments, the second resistor 4 is connected between the gate and the source of the first P-channel MOSFET 5. Alternatively, the second resistor 4 can be connected between the gate of the first P-channel MOSFET 5 and the power source 40. It is noted that a constant current source instead of the second resistor 4 can be connected between the gate of the first P-channel MOSFET 5 and the power source 40. In these cases, the current flowing through the first resistor 3 may have an error with respect to the gate current of the switching device. However, the error is very small and can be negligible. Alternatively, the current flowing through the first resistor 3 can be detected by taking the error into consideration.

In the eighth to nineteenth embodiments, the switching device 2 is located on the low side of the load 1. Alternatively, the switching device 2 can be located on the high side of the load 1.

Figure 29:
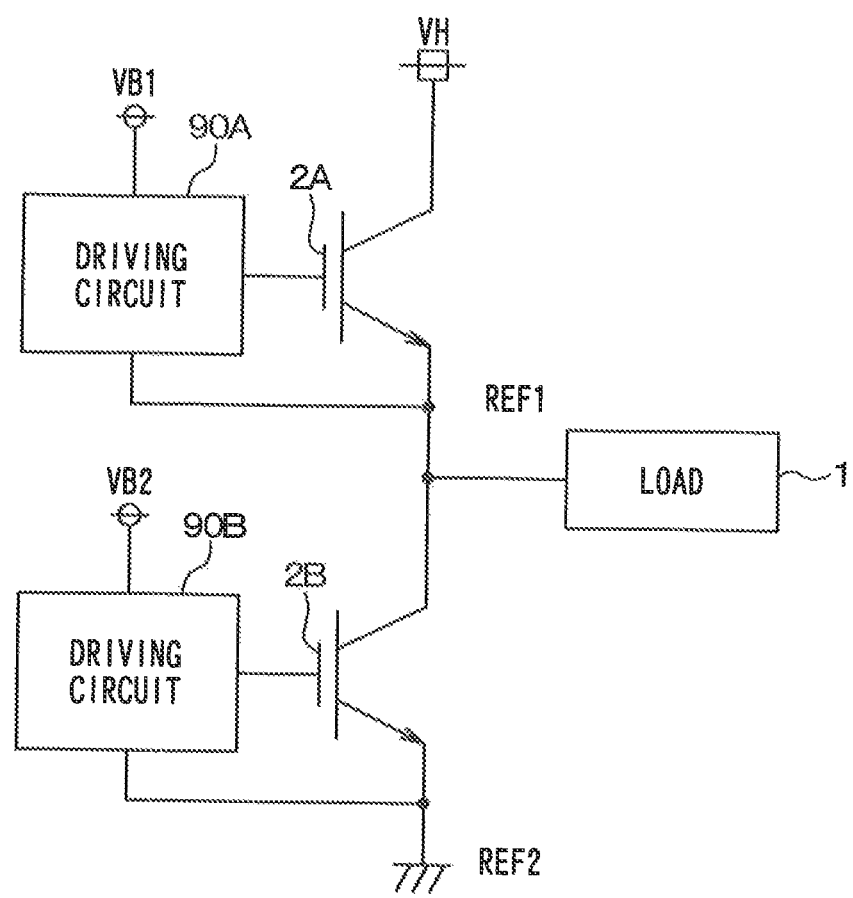
FIG. 29 is a circuit diagram of a load driving apparatus according to a modification of the present invention.

FIG. 29 is a diagram illustrating a load driving apparatus according to a modification of the embodiments. In FIG. 29, two switching devices 2A and 2B are connected in series to drive the load 1. The load driving apparatus includes a driving circuit 90A and a driving circuit 90B. The driving circuit 90A is any one of the ON-side driver circuits of the embodiments. The driving circuit 90B is any one of the OFF-side driver circuits of the embodiments. For example, the driving circuit 90A can be the ON-side driver circuit of the eighth embodiment, and the driving circuit 90B can be the OFF-side driver circuit of the tenth embodiment. For another example, the driving circuit 90A can be the ON-side driver circuit of the ninth embodiment, and the driving circuit 90B can be the OFF-side driver circuit of the eleventh embodiment.

As shown in FIG. 29, the switching device 2A is connected to the high side of the load 1, and the switching device 2B is connected to the low side of the load 1.

The driving circuit 90B and the switching device B operate based on a reference potential REF2 with reference to a high voltage VH (e.g., 650V). A power supply voltage VB2 for the driving circuit 90B is a voltage (e.g., 15V) with reference to the reference potential REF2. In contrast, the driving circuit 90B and the switching device 28 operate based on a reference potential REF1 that varies depending on conditions of the switching devices 2A and 28. Specifically, when the switching device 2A is ON, the reference potential REF1 is based on the high voltage VH. On the other hand, when the switching device 2B is ON, the reference potential REF1 is based on the reference potential REF2. In this way, the reference potential REF1 varies depending on the conditions of the switching devices 2A and 2B.

In the eighth to nineteenth embodiments, as a measure against heat, the first resistor 3, the second resistor 4, the first P-channel MOSFET 5, the first PNP transistor 12, the first N-channel MOSFET 14, and the first NPN transistor 16 are discrete components separate from the IC chip 9, Alternatively, depending on the amount of heat, the first resistor 3, the second resistor 4, the first P-channel MOSFET 5, the first PNP transistor 12, the first N-channel MOSFET 14, and the first NPN transistor 16 can be incorporated in the IC chip 9.

In the eighth to fifteenth embodiments, the second resistor 4 is connected between the low side of the first resistor 3 and the first resistor. For example, the second resistor 4 is connected between the low side of the first resistor 3 and the gate of the first P-channel MOSFET 5 so that it can be connected between the gate and the source of the first P-channel MOSFET 5. Alternatively, like the sixteenth embodiment, the second resistor 4 can be connected between the high side (i.e., power supply voltage VB side) of the first resistor 3 and the gate of the first P-channel MOSFET 5. In such an approach, all the current flowing through the first resistor 3 is supplied to the first P-channel MOSFET 5 so that the constant current can be stably supplied to the first P-channel MOSFET 5.

Figure 30:
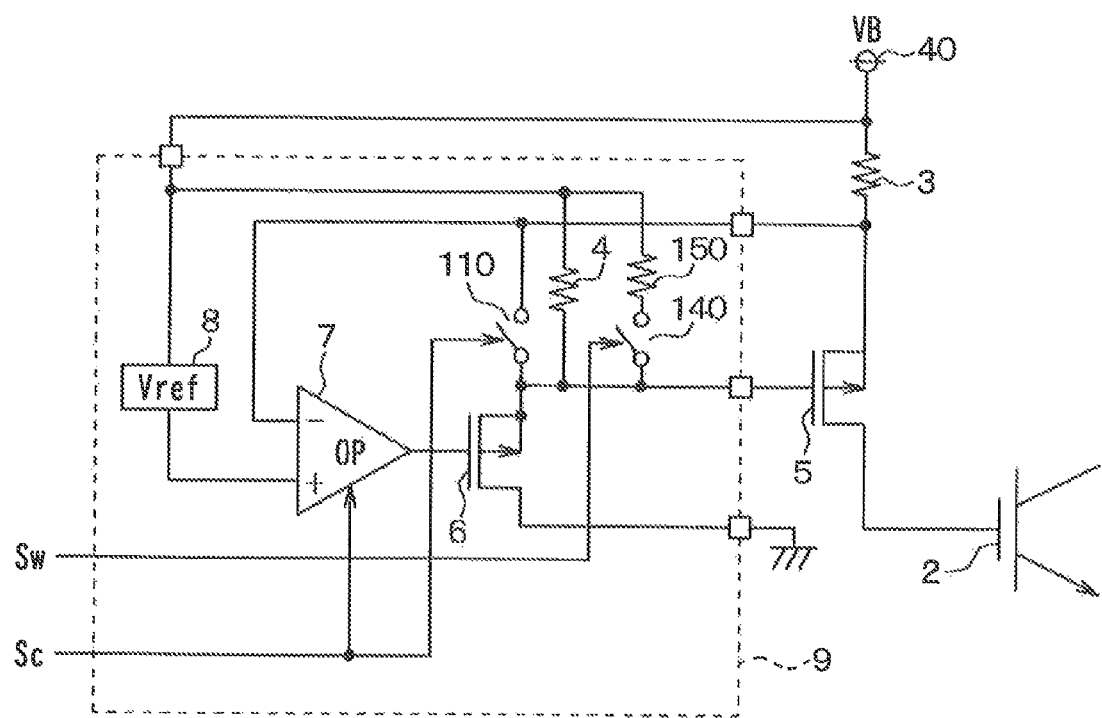
FIG. 30 is a circuit diagram of a load driving apparatus according to another modification of the present invention.

Further, the embodiments can be modified as shown in FIG. 30. The load driving apparatus of FIG. 30 is similar to the load driving apparatus of FIG. 11. A difference between them is as follows.

In FIG. 11, the drain of the second P-channel MOSFET 6 is connected to the gate of the switching device 2. In contrast, in FIG. 30, the drain of the second P-channel MOSFET 6 is connected to the reference potential (e.g., ground). Further, a series circuit of a resistor 150 and a switch 140 is connected in parallel to the second resistor 4. That is, the series circuit of the resistor 150 and the switch 140 is connected between the gate and the source of the first P-channel MOSFET 5. A resistance of the resistor 150 is less than a resistance of the second resistor 4. In such an approach, consumption current is effectively reduced. It is noted that the configuration shown in FIG. 30 can be applied to any embodiments.

Correspondence Between Embodiments and Claims

The gate, the emitter, and the collector of the IGBT correspond to a control terminal, a first terminal, and a second terminal of a switching device, respectively. The gate, the source, and the drain of the first P-channel MOSFET 5 correspond to a control terminal, a first terminal, and a second terminal of a first transistor, respectively. The gate, the source, and the drain of the second P-channel MOSFET correspond to a control terminal, a first terminal, and a second terminal of a second transistor, respectively. The base, the emitter, and the collector of the first PNP transistor 12 correspond to a control terminal, a first terminal, and a second terminal of a first transistor, respectively. The base, the emitter, and the collector of the second PNP transistor 12 correspond to a control terminal, a first terminal, and a second terminal of a second transistor, respectively. The gate, the source, and the drain of the first N-channel MOSFET 5 correspond to a control terminal, a first terminal, and a second terminal of a first transistor, respectively. The gate, the source, and the drain of the second N-channel MOSFET 6 correspond to a control terminal, a first terminal, and a second terminal of a second transistor, respectively. The base, the emitter, and the collector of the first NPN transistor 16 correspond to a control terminal, a first terminal, and a second terminal of a first transistor, respectively. The base, the emitter, and the collector of the second NPN transistor 17 correspond to a control terminal, a first terminal, and a second terminal of a second transistor, respectively.

Such changes and modifications are to be understood as being within the scope of the present invention as defined by the appended claims.

What is claimed is:

1. A load driving apparatus for driving a load with a constant current, the load driving apparatus comprising:
   a shunt resistor through which a shunt current corresponding to the constant current flows;
   a driver circuit connected to a first end of the shunt resistor to supply the constant current corresponding to the shunt current to the load, the driver circuit including a reference voltage source for generating a predetermined reference voltage, wherein
   the driver circuit adjusts the magnitude of the constant current by performing a feedback-control of the magnitude of the shunt current in such a manner that a first voltage corresponding to the reference voltage and a second voltage corresponding to a voltage at the first end of the shunt resistor become equal to each other,
   the driver circuit further includes an operational amplifier and a first switching element,
   the first voltage is applied to a first terminal of the operational amplifier,
   the second voltage is applied to a second terminal of the operational amplifier,
   the first switching element is switched by an output of the operational amplifier, and
   the operational amplifier keeps the magnitude of the shunt current at a constant value by switching the first switching element in such a manner that the first voltage and the second voltage become equal to each other; and
   a second switching element connected to the load and having a higher current capability than the first switching element, wherein
   the first end of the shunt resistor is connected to the driver circuit and the second switching element so that the shunt current is supplied as the constant current to the load through the second switching element,
   the first switching element and the second switching element are connected in a Darlington configuration in such a manner that the second switching element is driven by the first switching element and that a first current flowing though the first switching element is added to a second current flowing through the second switching element to form the constant current, and
   the driver circuit performs the feedback-control of the magnitude of the shunt current by driving the second switching element by driving the first switching element in such a manner that the first voltage and the second voltage become equal to each other.

2. A load driving apparatus comprising:
   a switching device having a control terminal for receiving a constant current, the switching device having first and second terminals for passing a load current therebetween upon receipt of the constant current by the control terminal of the switching device;
   a Darlington circuit including a first transistor, a second transistor connected to the first transistor in a Darlington configuration, a sensing resistor connected to a first terminal of the first transistor so that the constant current flows through the first resistor, and a pull-up member connected to a control terminal of the first transistor and a first terminal of the second transistor, second terminals of the first transistor and the second transistor being connected to the control terminal of the switching device;
   a first reference voltage source for generating a first reference voltage;
   an operational amplifier having a first terminal for receiving a first voltage corresponding to the first reference voltage and a second terminal for receiving a second voltage between the sensing resistor and the first transistor, the operational amplifier performing a feedback control of the constant current flowing through the sensing resistor in such a manner that the first voltage and the second voltage become equal to each other; and
   a first switch connected in parallel to the pull-up member and configured to connect and disconnect the control terminal of the first transistor to and from the first terminal of the first transistor.

3. The load driving apparatus according to claim 2, further comprising:
   a timer configured to output a switching signal to the first switch, wherein
   the operational amplifier controls the switching device through the Darlington circuit in response to an inputted control signal,
   the timer outputs the switching signal to the first switch after a predetermined elapsed time from when the control signal Sc is inputted to the operational amplifier, and
   the first switch is turned ON and connects the control terminal of the first transistor to the first terminal of the first transistor in response to the switching signal.

4. The load driving apparatus according to claim 2, further comprising:
   a switching signal generator configured to detect a voltage of the control terminal of the switching device and output a switching signal to the first switch when the detected voltage reaches a predetermined voltage, wherein
   the first switch is turned ON and connects the control terminal of the first transistor to the first terminal of the first transistor in response to the switching signal.

5. The load driving apparatus according to claim 2, further comprising:
   a second reference voltage source separate from the first reference voltage source and configured to generate a second reference voltage; and
   a second switch, wherein
   the second terminal of the second transistor is connected through the second switch to the second voltage source.

6. The load driving apparatus according to claim 5, wherein
   the second switch is turned ON in response to an inputted control signal so that the second terminal of the second transistor is connected to the second voltage source,
   when a voltage of the control terminal of the switching device exceeds a mirror voltage, the second switch is turned OFF so that a current flows from the second terminal of the second transistor to the control terminal of the switching device.

7. The load driving apparatus according to claim 5, further comprising:
   a diode located in a current path connecting a first node between the second terminal of the second transistor and the second switch to a second node between the control terminal of the switching device and the second terminal of the first transistor.

8. The load driving apparatus according to claim 2, further comprising:
a switching signal generator configured to detect a voltage between the first terminal of the first transistor and the second terminal of the first transistor and output a switching signal to the first switch when the detected voltage reaches a predetermined voltage, wherein
the first switch is turned ON and connects the control terminal of the first transistor to the first terminal of the first transistor in response to the switching signal.

9. The load driving apparatus according to claim 2, further comprising:
a switching signal generator configured to detect a voltage between the control terminal of the first transistor and the first terminal of the first transistor and output a switching signal to the first switch when the detected voltage reaches a predetermined voltage, wherein
the first switch is turned ON and connects the control terminal of the first transistor to the first terminal of the first transistor in response to the switching signal.

10. The load driving apparatus according to claim 2, further comprising:
a clamp circuit configured to perform a clamp action for clamping a voltage of the control terminal of the switching device to a predetermined clamp voltage, wherein
the clamp circuit outputs a switching signal to the first switch when the claim action is finished, and
the first switch is turned ON and connects the control terminal of the first transistor to the first terminal of the first transistor in response to the switching signal.

11. The load driving apparatus according to claim 2, wherein
the Darlington circuit, the operational amplifier, the first reference voltage source, and the first switch are connected between a power source and the control terminal of the switching device and configured as a ON-side driver circuit for turning ON the switching device by supplying the constant current from the Darlington circuit to the control terminal of the switching device,
the sensing resistor and the first reference voltage source are connected to the power source,
the first voltage is obtained by subtracting the first reference voltage from a power supply voltage of the power source, and
the second voltage is obtained by subtracting a voltage drop across the sensing resistor from the power supply voltage.

12. The load driving apparatus according to claim 11, wherein
each of the first transistor and the second transistor is a P-channel MOSFET,
the sensing resistor is connected between the power source and a source of the first transistor,
the pull-up member and the first switch are connected between a gate of the first transistor and the source of the first transistor, and
a gate of the second transistor is connected to an output terminal of the operational amplifier.

13. The load driving apparatus according to claim 11, wherein
each of the first transistor and the second transistor is a PNP bipolar transistor,
the sensing resistor is connected between the power source and an emitter of the first transistor,
the pull-up member and the first switch are connected between a base of the first transistor and the emitter of the first transistor, and
a base of the second transistor is connected to an output terminal of the operational amplifier.

14. The load driving apparatus according to claim 2, wherein
the Darlington circuit, the operational amplifier, the first reference voltage source, and the first switch are connected between a predetermined reference potential and the control terminal of the switching device and configured as a OFF-side driver circuit for turning OFF the switching device by causing the constant current to flow from the control terminal of the switching device to the Darlington circuit,
the sensing resistor and the first reference voltage source are connected to the reference potential,
the first voltage is the first reference voltage, and
the second voltage is a voltage drop across the sensing resistor.

15. The load driving apparatus according to claim 14, wherein each of the first transistor and the second transistor is an N-channel MOSFET,
the sensing resistor is connected between a predetermined reference potential and a source of the first transistor,
the pull-up member and the first switch are connected between a gate of the first transistor and the source of the first transistor, and
a gate of the second transistor is connected to an output terminal of the operational amplifier.

16. The load driving apparatus according to claim 14, wherein
each of the first transistor and the second transistor is an NPN bipolar transistor,
the sensing resistor is connected between a predetermined reference potential and an emitter of the first transistor,
the pull-up member and the first switch are connected between a base of the first transistor and the emitter of the first transistor, and
a base of the second transistor is connected to an output terminal of the operational amplifier.

17. A load driving apparatus comprising:
a switching device having a control terminal for receiving a constant current, the switching device having first and second terminals for passing a load current therebetween upon receipt of the constant current by the control terminal of the switching device;
a Darlington circuit including a first transistor, a second transistor connected to the first transistor in a Darlington configuration, a first resistor connected to a first terminal of the first transistor so that the constant current flows through the first resistor, and a second resistor connected to a control terminal of the first transistor and a first terminal of the second transistor, a second terminal of the first transistor being connected to the control terminal of the switching device, a second terminal of the second transistor being connected to a ground potential;
a reference voltage source for generating a reference voltage;
an operational amplifier having a first terminal for receiving a first voltage corresponding to the reference voltage and a second terminal for receiving a second voltage between the first resistor and the first transistor, the operational amplifier performing a feedback control of the constant current flowing through the first resistor in such a manner that the first voltage and the second voltage become equal to each other;

a first switch connected in parallel to the second resistor and configured to connect and disconnect the control terminal of the first transistor to and from the first terminal of the first transistor; and a series circuit of a third resistor and a second switch, wherein the series circuit is connected in parallel to the second resistor, and a resistance of the third resistor is less than a resistance of the second resistor.

* * * * *